(12) United States Patent
Steiner et al.

(10) Patent No.: US 8,850,297 B1
(45) Date of Patent: Sep. 30, 2014

(54) SYSTEM AND METHOD FOR MULTI-DIMENSIONAL ENCODING AND DECODING

(71) Applicant: Densbits Technologies Ltd., Haifa (IL)

(72) Inventors: Avi Steiner, Kiryat Motzkin (IL); Erez Sabbag, Kiryat Tivon (IL); Avigdor Segal, Netanya (IL); Ilan Bar, Kiryat Motzkin (IL); Eli Sterin, Yoqneam (IL)

(73) Assignee: Densbits Technologies Ltd., Haifa (IL)

( * ) Notice: Subject to any disclaimer, the term of this patent is extended or adjusted under 35 U.S.C. 154(b) by 0 days.

(21) Appl. No.: 14/141,671

(22) Filed: Dec. 27, 2013

Related U.S. Application Data

(63) Continuation of application No. 13/171,214, filed on Jun. 28, 2011, now Pat. No. 8,621,321.

(60) Provisional application No. 61/360,817, filed on Jul. 1, 2010.

(51) Int. Cl.
*H03M 13/00* (2006.01)
*G06F 11/10* (2006.01)
*H03M 13/15* (2006.01)

(52) U.S. Cl.
CPC .............. *G06F 11/10* (2013.01); *H03M 13/152* (2013.01)
USPC ............................ 714/781; 714/782; 714/758

(58) Field of Classification Search
CPC .............................. G06F 11/10; H03M 13/152
USPC .................. 714/762, 794, 780, 781, 782, 758
See application file for complete search history.

(56) References Cited

U.S. PATENT DOCUMENTS

| | | | |
|---|---|---|---|
| 4,430,701 A | 2/1984 | Christian et al. | |
| 4,463,375 A | 7/1984 | Macovski | |
| 4,584,686 A | 4/1986 | Fritze | |
| 4,589,084 A | 5/1986 | Fling et al. | |
| 4,777,589 A | 10/1988 | Boettner et al. | |
| 4,866,716 A | 9/1989 | Weng | |
| 5,003,597 A | 3/1991 | Merkle | |
| 5,077,737 A | 12/1991 | Leger et al. | |
| 5,297,153 A | 3/1994 | Baggen et al. | |
| 5,305,276 A | 4/1994 | Uenoyama | |
| 5,450,421 A * | 9/1995 | Joo et al. ....................... | 714/756 |
| 5,592,641 A | 1/1997 | Doyle et al. | |
| 5,623,620 A | 4/1997 | Ranjeet et al. | |

(Continued)

OTHER PUBLICATIONS

Search Report of PCT Patent Application WO 2009/118720 A3, Mar. 4, 2010.

(Continued)

*Primary Examiner* — David Ton
(74) *Attorney, Agent, or Firm* — Dentons US LLP

(57) ABSTRACT

A system and method for using a cyclic redundancy check (CRC) to evaluate error corrections. A set of data and initial CRC values associated therewith may be received. The set of data by changing a sub-set of the data may be corrected. Intermediate CRC values may be computed for the entire uncorrected set of data in parallel with said correcting. Supplemental CRC values may be computed for only the sub-set of changed data after said correcting. The intermediate and supplemental CRC values may be combined to generate CRC values for the entire corrected set of data. The validity of the corrected set of data may be evaluated by comparing the combined CRC values with the initial CRC values.

20 Claims, 14 Drawing Sheets

(56) References Cited

U.S. PATENT DOCUMENTS

| | | | |
|---|---|---|---|
| 5,640,529 | A | 6/1997 | Hasbun |
| 5,657,332 | A | 8/1997 | Auclair et al. |
| 5,663,901 | A | 9/1997 | Harari et al. |
| 5,724,538 | A | 3/1998 | Morris et al. |
| 5,729,490 | A | 3/1998 | Calligaro et al. |
| 5,740,395 | A | 4/1998 | Wells et al. |
| 5,745,418 | A | 4/1998 | Hu et al. |
| 5,778,430 | A | 7/1998 | Ish et al. |
| 5,793,774 | A | 8/1998 | Usui et al. |
| 5,920,578 | A | 7/1999 | Zook et al. |
| 5,926,409 | A | 7/1999 | Engh et al. |
| 5,933,368 | A | 8/1999 | Hu et al. |
| 5,956,268 | A | 9/1999 | Lee |
| 5,956,473 | A | 9/1999 | Hu et al. |
| 5,968,198 | A | 10/1999 | Balachandran |
| 5,982,659 | A | 11/1999 | Irrinki et al. |
| 6,011,741 | A | 1/2000 | Harari et al. |
| 6,016,275 | A | 1/2000 | Han |
| 6,038,634 | A | 3/2000 | Ji et al. |
| 6,047,395 | A * | 4/2000 | Zook ............................. 714/756 |
| 6,081,878 | A | 6/2000 | Estakhri et al. |
| 6,094,465 | A | 7/2000 | Stein et al. |
| 6,119,245 | A | 9/2000 | Hiratsuka |
| 6,131,178 | A * | 10/2000 | Fujita et al. ................... 714/784 |
| 6,182,261 | B1 | 1/2001 | Haller et al. |
| 6,192,497 | B1 | 2/2001 | Yang et al. |
| 6,195,287 | B1 | 2/2001 | Hirano |
| 6,199,188 | B1 | 3/2001 | Shen et al. |
| 6,209,114 | B1 | 3/2001 | Wolf et al. |
| 6,259,627 | B1 | 7/2001 | Wong |
| 6,272,052 | B1 | 8/2001 | Miyauchi |
| 6,278,633 | B1 | 8/2001 | Wong et al. |
| 6,279,133 | B1 | 8/2001 | Vafai et al. |
| 6,301,151 | B1 | 10/2001 | Engh et al. |
| 6,370,061 | B1 | 4/2002 | Yachareni et al. |
| 6,374,383 | B1 | 4/2002 | Weng |
| 6,504,891 | B1 | 1/2003 | Chevallier |
| 6,532,169 | B1 | 3/2003 | Mann et al. |
| 6,532,556 | B1 | 3/2003 | Wong et al. |
| 6,553,533 | B2 | 4/2003 | Demura et al. |
| 6,560,747 | B1 | 5/2003 | Weng |
| 6,637,002 | B1 | 10/2003 | Weng et al. |
| 6,639,865 | B2 | 10/2003 | Kwon |
| 6,643,819 | B1 * | 11/2003 | Weng ............................. 714/785 |
| 6,674,665 | B1 | 1/2004 | Mann et al. |
| 6,675,281 | B1 | 1/2004 | Oh et al. |
| 6,704,902 | B1 | 3/2004 | Shinbashi et al. |
| 6,751,766 | B2 | 6/2004 | Guterman et al. |
| 6,772,274 | B1 | 8/2004 | Estakhri |
| 6,781,910 | B2 | 8/2004 | Smith |
| 6,792,569 | B2 | 9/2004 | Cox et al. |
| 6,873,543 | B2 | 3/2005 | Smith et al. |
| 6,891,768 | B2 | 5/2005 | Smith et al. |
| 6,914,809 | B2 | 7/2005 | Hilton et al. |
| 6,915,477 | B2 | 7/2005 | Gollamudi et al. |
| 6,952,365 | B2 | 10/2005 | Gonzalez et al. |
| 6,961,890 | B2 | 11/2005 | Smith |
| 6,968,421 | B2 | 11/2005 | Conley |
| 6,990,012 | B2 | 1/2006 | Smith et al. |
| 6,996,004 | B1 | 2/2006 | Fastow et al. |
| 6,999,854 | B2 | 2/2006 | Roth |
| 7,010,739 | B1 | 3/2006 | Feng et al. |
| 7,012,835 | B2 | 3/2006 | Gonzalez et al. |
| 7,038,950 | B1 | 5/2006 | Hamilton et al. |
| 7,068,539 | B2 | 6/2006 | Guterman et al. |
| 7,079,436 | B2 | 7/2006 | Perner et al. |
| 7,149,950 | B2 | 12/2006 | Spencer et al. |
| 7,177,977 | B2 | 2/2007 | Chen et al. |
| 7,188,228 | B1 | 3/2007 | Chang et al. |
| 7,191,379 | B2 | 3/2007 | Adelmann et al. |
| 7,196,946 | B2 | 3/2007 | Chen et al. |
| 7,203,874 | B2 | 4/2007 | Roohparvar |
| 7,212,426 | B2 | 5/2007 | Park et al |
| 7,290,203 | B2 | 10/2007 | Emma et al. |
| 7,292,365 | B2 | 11/2007 | Knox |
| 7,301,928 | B2 | 11/2007 | Nakabayashi et al. |
| 7,315,916 | B2 | 1/2008 | Bennett et al. |
| 7,388,781 | B2 | 6/2008 | Litsyn et al. |
| 7,395,404 | B2 | 7/2008 | Gorobets et al. |
| 7,441,067 | B2 | 10/2008 | Gorobets et al. |
| 7,443,729 | B2 | 10/2008 | Li et al. |
| 7,450,425 | B2 | 11/2008 | Aritome |
| 7,454,670 | B2 | 11/2008 | Kim et al. |
| 7,466,575 | B2 | 12/2008 | Shalvi et al. |
| 7,533,328 | B2 | 5/2009 | Alrod et al. |
| 7,558,109 | B2 | 7/2009 | Brandman et al. |
| 7,593,263 | B2 | 9/2009 | Sokolov et al. |
| 7,610,433 | B2 | 10/2009 | Randell et al. |
| 7,613,043 | B2 | 11/2009 | Cornwell et al. |
| 7,619,922 | B2 | 11/2009 | Li et al. |
| 7,697,326 | B2 | 4/2010 | Sommer et al. |
| 7,706,182 | B2 | 4/2010 | Shalvi et al. |
| 7,716,538 | B2 | 5/2010 | Gonzalez et al. |
| 7,804,718 | B2 | 9/2010 | Kim |
| 7,805,663 | B2 | 9/2010 | Brandman et al. |
| 7,805,664 | B1 | 9/2010 | Yang et al. |
| 7,844,877 | B2 | 11/2010 | Litsyn et al. |
| 7,911,848 | B2 | 3/2011 | Eun et al. |
| 7,961,797 | B1 | 6/2011 | Yang et al. |
| 7,975,192 | B2 | 7/2011 | Sommer et al. |
| 8,020,073 | B2 | 9/2011 | Emma et al. |
| 8,108,590 | B2 | 1/2012 | Chow et al. |
| 8,122,328 | B2 | 2/2012 | Liu et al. |
| 8,159,881 | B2 | 4/2012 | Yang |
| 8,190,961 | B1 | 5/2012 | Yang et al. |
| 8,250,324 | B2 | 8/2012 | Haas et al. |
| 8,300,823 | B2 | 10/2012 | Bojinov et al. |
| 8,305,812 | B2 | 11/2012 | Levy et al. |
| 8,327,246 | B2 | 12/2012 | Weingarten et al. |
| 8,407,560 | B2 | 3/2013 | Ordentlich et al. |
| 8,417,893 | B2 | 4/2013 | Khmelnitsky et al. |
| 8,453,038 | B2 * | 5/2013 | Anholt ............................. 714/781 |
| 2001/0034815 | A1 | 10/2001 | Dugan et al. |
| 2002/0063774 | A1 | 5/2002 | Hillis et al. |
| 2002/0085419 | A1 | 7/2002 | Kwon et al. |
| 2002/0154769 | A1 | 10/2002 | Petersen et al. |
| 2002/0156988 | A1 | 10/2002 | Toyama et al. |
| 2002/0174156 | A1 | 11/2002 | Birru et al. |
| 2003/0014582 | A1 | 1/2003 | Nakanishi |
| 2003/0065876 | A1 | 4/2003 | Lasser |
| 2003/0101404 | A1 | 5/2003 | Zhao et al. |
| 2003/0105620 | A1 | 6/2003 | Bowen |
| 2003/0177300 | A1 | 9/2003 | Lee et al. |
| 2003/0192007 | A1 | 10/2003 | Miller et al. |
| 2004/0015771 | A1 | 1/2004 | Lasser et al. |
| 2004/0030971 | A1 | 2/2004 | Tanaka et al. |
| 2004/0059768 | A1 | 3/2004 | Denk et al. |
| 2004/0080985 | A1 | 4/2004 | Chang et al. |
| 2004/0153722 | A1 | 8/2004 | Lee |
| 2004/0153817 | A1 | 8/2004 | Norman et al. |
| 2004/0181735 | A1 | 9/2004 | Xin |
| 2004/0203591 | A1 | 10/2004 | Lee |
| 2004/0210706 | A1 | 10/2004 | In et al. |
| 2005/0013165 | A1 | 1/2005 | Ban |
| 2005/0018482 | A1 | 1/2005 | Cemea et al. |
| 2005/0083735 | A1 | 4/2005 | Chen et al. |
| 2005/0117401 | A1 | 6/2005 | Chen et al. |
| 2005/0120265 | A1 | 6/2005 | Pline et al. |
| 2005/0128811 | A1 | 6/2005 | Kato et al. |
| 2005/0138533 | A1 | 6/2005 | Le-Bars et al. |
| 2005/0144213 | A1 | 6/2005 | Simkins et al. |
| 2005/0144368 | A1 | 6/2005 | Chung et al. |
| 2005/0169057 | A1 | 8/2005 | Shibata et al. |
| 2005/0172179 | A1 | 8/2005 | Brandenberger et al. |
| 2005/0213393 | A1 | 9/2005 | Lasser |
| 2005/0243626 | A1 | 11/2005 | Ronen |
| 2006/0059406 | A1 | 3/2006 | Micheloni et al. |
| 2006/0059409 | A1 | 3/2006 | Lee |
| 2006/0064537 | A1 | 3/2006 | Oshima et al. |
| 2006/0101193 | A1 | 5/2006 | Murin |
| 2006/0195651 | A1 | 8/2006 | Estakhri et al. |
| 2006/0203587 | A1 | 9/2006 | Li et al. |
| 2006/0221692 | A1 | 10/2006 | Chen |
| 2006/0248434 | A1 | 11/2006 | Radke et al. |

(56) References Cited

U.S. PATENT DOCUMENTS

| | | |
|---|---|---|
| 2006/0268608 A1 | 11/2006 | Noguchi et al. |
| 2006/0282411 A1 | 12/2006 | Fagin et al. |
| 2006/0284244 A1 | 12/2006 | Forbes et al. |
| 2006/0294312 A1 | 12/2006 | Walmsley |
| 2007/0025157 A1 | 2/2007 | Wan et al. |
| 2007/0063180 A1 | 3/2007 | Asano et al. |
| 2007/0081388 A1 | 4/2007 | Joo |
| 2007/0098069 A1 | 5/2007 | Gordon |
| 2007/0103992 A1 | 5/2007 | Sakui et al. |
| 2007/0104004 A1 | 5/2007 | So et al. |
| 2007/0109858 A1 | 5/2007 | Conley et al. |
| 2007/0124652 A1 | 5/2007 | Litsyn et al. |
| 2007/0140006 A1 | 6/2007 | Chen et al. |
| 2007/0143561 A1 | 6/2007 | Gorobets |
| 2007/0150694 A1 | 6/2007 | Chang et al. |
| 2007/0168625 A1 | 7/2007 | Cornwell et al. |
| 2007/0171714 A1 | 7/2007 | Wu et al. |
| 2007/0171730 A1 | 7/2007 | Ramamoorthy et al. |
| 2007/0180346 A1 | 8/2007 | Murin |
| 2007/0223277 A1 | 9/2007 | Tanaka et al. |
| 2007/0226582 A1 | 9/2007 | Tang et al. |
| 2007/0226592 A1 | 9/2007 | Radke |
| 2007/0228449 A1 | 10/2007 | Takano et al. |
| 2007/0253249 A1 | 11/2007 | Kang et al. |
| 2007/0253250 A1 | 11/2007 | Shibata et al. |
| 2007/0263439 A1 | 11/2007 | Cornwell et al. |
| 2007/0266291 A1 | 11/2007 | Toda et al. |
| 2007/0271494 A1 | 11/2007 | Gorobets |
| 2007/0297226 A1 | 12/2007 | Mokhlesi |
| 2008/0010581 A1 | 1/2008 | Alrod et al. |
| 2008/0028014 A1 | 1/2008 | Hilt et al. |
| 2008/0049497 A1 | 2/2008 | Mo |
| 2008/0055989 A1 | 3/2008 | Lee et al. |
| 2008/0082897 A1 | 4/2008 | Brandman et al. |
| 2008/0092026 A1 | 4/2008 | Brandman et al. |
| 2008/0104309 A1 | 5/2008 | Cheon et al. |
| 2008/0112238 A1 | 5/2008 | Kim et al. |
| 2008/0116509 A1 | 5/2008 | Harari et al. |
| 2008/0126686 A1 | 5/2008 | Sokolov et al. |
| 2008/0127104 A1 | 5/2008 | Li et al. |
| 2008/0128790 A1 | 6/2008 | Jung |
| 2008/0130341 A1 | 6/2008 | Shalvi et al. |
| 2008/0137413 A1 | 6/2008 | Kong et al. |
| 2008/0137414 A1 | 6/2008 | Park et al. |
| 2008/0141043 A1 | 6/2008 | Flynn et al. |
| 2008/0148115 A1 | 6/2008 | Sokolov et al. |
| 2008/0158958 A1 | 7/2008 | Shalvi et al. |
| 2008/0159059 A1 | 7/2008 | Moyer |
| 2008/0162079 A1 | 7/2008 | Astigarraga et al. |
| 2008/0168216 A1 | 7/2008 | Lee |
| 2008/0168320 A1 | 7/2008 | Cassuto et al. |
| 2008/0181001 A1 | 7/2008 | Shalvi |
| 2008/0198650 A1 | 8/2008 | Shalvi et al. |
| 2008/0198652 A1 | 8/2008 | Shalvi et al. |
| 2008/0201620 A1 | 8/2008 | Gollub |
| 2008/0209114 A1 | 8/2008 | Chow et al. |
| 2008/0219050 A1 | 9/2008 | Shalvi et al. |
| 2008/0225599 A1 | 9/2008 | Chae |
| 2008/0250195 A1 | 10/2008 | Chow et al. |
| 2008/0263262 A1 | 10/2008 | Sokolov et al. |
| 2008/0282106 A1 | 11/2008 | Shalvi et al. |
| 2008/0285351 A1 | 11/2008 | Shlick et al. |
| 2008/0301532 A1 | 12/2008 | Uchikawa et al. |
| 2009/0024905 A1 | 1/2009 | Shalvi et al. |
| 2009/0027961 A1 | 1/2009 | Park et al. |
| 2009/0043951 A1 | 2/2009 | Shalvi et al. |
| 2009/0046507 A1 | 2/2009 | Aritome |
| 2009/0072303 A9 | 3/2009 | Prall et al. |
| 2009/0091979 A1 | 4/2009 | Shalvi |
| 2009/0103358 A1 | 4/2009 | Sommer et al. |
| 2009/0106485 A1 | 4/2009 | Anholt |
| 2009/0113275 A1 | 4/2009 | Chen et al. |
| 2009/0125671 A1 | 5/2009 | Flynn et al. |
| 2009/0132755 A1 | 5/2009 | Radke |
| 2009/0144598 A1 | 6/2009 | Yoon et al. |
| 2009/0144600 A1 | 6/2009 | Perlmutter et al. |
| 2009/0150599 A1 | 6/2009 | Bennett |
| 2009/0150748 A1 | 6/2009 | Egner et al. |
| 2009/0157964 A1 | 6/2009 | Kasorla et al. |
| 2009/0158126 A1 | 6/2009 | Perlmutter et al. |
| 2009/0168524 A1 | 7/2009 | Golov et al. |
| 2009/0187803 A1 | 7/2009 | Anholt et al. |
| 2009/0199074 A1 | 8/2009 | Sommer |
| 2009/0213653 A1 | 8/2009 | Perlmutter et al. |
| 2009/0213654 A1 | 8/2009 | Perlmutter et al. |
| 2009/0228761 A1 | 9/2009 | Perlmutter et al. |
| 2009/0240872 A1 | 9/2009 | Perlmutter et al. |
| 2009/0282185 A1 | 11/2009 | Van Cauwenbergh |
| 2009/0282186 A1 | 11/2009 | Mokhlesi et al. |
| 2009/0287930 A1 | 11/2009 | Nagaraja |
| 2009/0300269 A1 | 12/2009 | Radke et al. |
| 2009/0323942 A1 | 12/2009 | Sharon et al. |
| 2010/0005270 A1 | 1/2010 | Jiang |
| 2010/0025811 A1 | 2/2010 | Bronner et al. |
| 2010/0030944 A1 | 2/2010 | Hinz |
| 2010/0058146 A1 | 3/2010 | Weingarten et al. |
| 2010/0064096 A1 | 3/2010 | Weingarten et al. |
| 2010/0088557 A1 | 4/2010 | Weingarten et al. |
| 2010/0091535 A1 | 4/2010 | Sommer et al. |
| 2010/0095186 A1 | 4/2010 | Weingarten |
| 2010/0110787 A1 | 5/2010 | Shalvi et al. |
| 2010/0115376 A1 | 5/2010 | Shalvi et al. |
| 2010/0122113 A1 | 5/2010 | Weingarten et al. |
| 2010/0124088 A1 | 5/2010 | Shalvi et al. |
| 2010/0131580 A1 | 5/2010 | Kanter et al. |
| 2010/0131806 A1 | 5/2010 | Weingarten et al. |
| 2010/0131809 A1 | 5/2010 | Katz |
| 2010/0131826 A1 | 5/2010 | Shalvi et al. |
| 2010/0131827 A1 | 5/2010 | Sokolov et al. |
| 2010/0131831 A1 | 5/2010 | Weingarten et al. |
| 2010/0146191 A1 | 6/2010 | Katz |
| 2010/0146192 A1 | 6/2010 | Weingarten et al. |
| 2010/0149881 A1 | 6/2010 | Lee et al. |
| 2010/0172179 A1 | 7/2010 | Gorobets et al. |
| 2010/0174853 A1 | 7/2010 | Lee et al. |
| 2010/0180073 A1 | 7/2010 | Weingarten et al. |
| 2010/0199149 A1 | 8/2010 | Weingarten et al. |
| 2010/0211724 A1 | 8/2010 | Weingarten |
| 2010/0211833 A1 | 8/2010 | Weingarten |
| 2010/0211856 A1 | 8/2010 | Weingarten |
| 2010/0241793 A1 | 9/2010 | Sugimoto et al. |
| 2010/0246265 A1 | 9/2010 | Moschiano et al. |
| 2010/0251066 A1 | 9/2010 | Radke |
| 2010/0253555 A1 | 10/2010 | Weingarten et al. |
| 2010/0257309 A1 | 10/2010 | Barsky et al. |
| 2010/0269008 A1 | 10/2010 | Leggette et al. |
| 2010/0293321 A1 | 11/2010 | Weingarten |
| 2010/0318724 A1 | 12/2010 | Yeh |
| 2011/0051521 A1 | 3/2011 | Levy et al. |
| 2011/0055461 A1 | 3/2011 | Steiner et al. |
| 2011/0093650 A1 | 4/2011 | Kwon et al. |
| 2011/0096612 A1 | 4/2011 | Steiner et al. |
| 2011/0099460 A1 | 4/2011 | Dusija et al. |
| 2011/0119562 A1 | 5/2011 | Steiner et al. |
| 2011/0153919 A1 | 6/2011 | Sabbag |
| 2011/0161775 A1 | 6/2011 | Weingarten |
| 2011/0194353 A1 | 8/2011 | Hwang et al. |
| 2011/0209028 A1 | 8/2011 | Post et al. |
| 2011/0214029 A1 | 9/2011 | Steiner et al. |
| 2011/0214039 A1 | 9/2011 | Steiner et al. |
| 2011/0246792 A1 | 10/2011 | Weingarten |
| 2011/0246852 A1 | 10/2011 | Sabbag |
| 2011/0252187 A1 | 10/2011 | Segal et al. |
| 2011/0252188 A1 | 10/2011 | Weingarten |
| 2011/0271043 A1 | 11/2011 | Segal et al. |
| 2011/0302428 A1 | 12/2011 | Weingarten |
| 2012/0001778 A1 | 1/2012 | Steiner et al. |
| 2012/0005554 A1 | 1/2012 | Steiner et al. |
| 2012/0005558 A1 | 1/2012 | Steiner et al. |
| 2012/0005560 A1 | 1/2012 | Steiner et al. |
| 2012/0008401 A1 | 1/2012 | Katz et al. |
| 2012/0008414 A1 | 1/2012 | Katz et al. |
| 2012/0017136 A1 | 1/2012 | Ordentlich et al. |
| 2012/0051144 A1 | 3/2012 | Weingarten et al. |

(56) References Cited

U.S. PATENT DOCUMENTS

| | | |
|---|---|---|
| 2012/0063227 A1 | 3/2012 | Weingarten et al. |
| 2012/0066441 A1 | 3/2012 | Weingarten |
| 2012/0110250 A1 | 5/2012 | Sabbag et al. |
| 2012/0124273 A1 | 5/2012 | Goss et al. |
| 2012/0246391 A1 | 9/2012 | Meir et al. |

OTHER PUBLICATIONS

Search Report of PCT Patent Application WO 2009/095902 A3, Mar. 4, 2010.
Search Report of PCT Patent Application WO 2009/078006 A3, Mar. 4, 2010.
Search Report of PCT Patent Application WO 2009/074979 A3, Mar. 4, 2010.
Search Report of PCT Patent Application WO 2009/074978 A3, Mar. 4, 2010.
Search Report of PCT Patent Application WO 2009/072105 A3, Mar. 4, 2010.
Search Report of PCT Patent Application WO 2009/072104 A3, Mar. 4, 2010.
Search Report of PCT Patent Application WO 2009/072103 A3, Mar. 4, 2010.
Search Report of PCT Patent Application WO 2009/072102 A3, Mar. 4, 2010.
Search Report of PCT Patent Application WO 2009/072101 A3, Mar. 4, 2010.
Search Report of PCT Patent Application WO 2009/072100 A3, Mar. 4, 2010.
Search Report of PCT Patent Application WO 2009/053963 A3, Mar. 4, 2010.
Search Report of PCT Patent Application WO 2009/053962 A3, Mar. 4, 2010.
Search Report of PCT Patent Application WO 2009/053961 A3, Mar. 4, 2010.
Search Report of PCT Patent Application WO 2009/037697 A3, Mar. 4, 2010.
Yani Chen, Keshab K. Parhi, "Small Area Parallel Chien Search Architectures for Long BCH Codes", Ieee Transactions On Very Large Scale Integration(VLSI) Systems, vol. 12, No. 5, May 2004.
Yuejian Wu, "Low Power Decoding of BCH Codes", Nortel Networks, Ottawa, Ont., Canada, in Circuits and systems, 2004. ISCAS '04. Proceeding of the 2004 International Symposium on Circuits and Systems, published May 23-26, 2004, vol. 2, pp. II-369-372 vol. 2.
Michael Purser, "Introduction to Error Correcting Codes", Artech House Inc., 1995.
Ron M. Roth, "Introduction to Coding Theory", Cambridge University Press, 2006.
Akash Kumar, Sergei Sawitzki, "High-Throughput and Low Power Architectures for Reed Solomon Decoder", (a.kumar at tue.nl, Eindhoven University of Technology and sergei.sawitzki at philips.com), Oct. 2005.

Todd K.Moon, "Error Correction Coding Mathematical Methods and Algorithms", A John Wiley & Sons, Inc., 2005.
Richard E. Blahut, "Algebraic Codes for Data Transmission", Cambridge University Press, 2003.
David Esseni, Bruno Ricco, "Trading-Off Programming Speed and Current Absorption in Flash Memories with the Ramped-Gate Programming Technique", Ieee Transactions On Electron Devices, vol. 47, No. 4, Apr. 2000.
Giovanni Campardo, Rino Micheloni, David Novosel, "VLSI-Design of Non-Volatile Memories", Springer Berlin Heidelberg New York, 2005.
John G. Proakis, "Digital Communications", 3rd ed., New York: McGraw-Hill, 1995.
J.M. Portal, H. Aziza, D. Nee, "EEPROM Memory: Threshold Voltage Built In Self Diagnosis", ITC International Test Conference, Paper 2.1, Feb. 2005.
J.M. Portal, H. Aziza, D. Nee, "EEPROM Diagnosis Based on Threshold Voltage Embedded Measurement", Journal of Electronic Testing: Theory and Applications 21, 33-42, 2005.
G. Tao, A. Scarpa, J. Dijkstra, W. Stidl, F. Kuper, "Data retention prediction for modern floating gate non-volatile memories", Microelectronics Reliability 40 (2000), 1561-1566.
T. Hirncno, N. Matsukawa, H. Hazama, K. Sakui, M. Oshikiri, K. Masuda, K. Kanda, Y. Itoh, J. Miyamoto, "A New Technique for Measuring Threshold Voltage Distribution in Flash EEPROM Devices", Proc. IEEE 1995 Int. Conference on Microelectronics Test Structures, vol. 8, Mar. 1995.
Boaz Eitan, Guy Cohen, Assaf Shappir, Eli Lusky, Amichai Givant, Meir Janai, Ilan Bloom, Yan Polansky, Oleg Dadashev, Avi Lavan, Ran Sahar, Eduardo Maayan, "4-bit per Cell NROM Reliability", Appears on the website of Saifun.com, 2005.
Paulo Cappelletti, Clara Golla, Piero Olivo, Enrico Zanoni, "Flash Memories", Kluwer Academic Publishers, 1999.
JEDEC Standard, "Stress-Test-Driven Qualification of Integrated Circuits", JEDEC Solid State Technology Association. JEDEC Standard No. 47F pp. 1-26, Dec. 2007.
Dempster, et al., "Maximum Likelihood from Incomplete Data via the EM Algorithm", Journal of the Royal Statistical Society. Series B (Methodological), vol. 39, No. 1 (1997), pp. 1-38.
Mielke, et al., "Flash EEPROM Threshold Instabilities due to Charge Trapping During Program/Erase Cycling", IEEE Transactions on Device and Materials Reliability, vol. 4, No. 3, Sep. 2004, pp. 335-344.
Daneshbeh, "Bit Serial Systolic Architectures for Multiplicative Inversion and Division over GF (2)", A thesis presented to the University of Waterloo, Ontario, Canada, 2005, pp. 1-118.
Chen, Formulas for the solutions of Quadratic Equations over GF (2), IEEE Trans. Inform. Theory, vol. IT-28, No. 5, Sep. 1982, pp. 792-794.
Berlekamp et al., "On the Solution of Algebraic Equations over Finite Fields", Inform. Cont. 10, Oct. 1967, pp. 553-564.

* cited by examiner

SYSTEM AND METHOD FOR MULTI-DIMENSIONAL ENCODING AND DECODING

REFERENCE TO RELATED APPLICATION

This application is a continuation of U.S. Non-provisional patent application Ser. No. 13/171,214, filed on Jun. 28, 2011, which claims priority from U.S. Provisional Patent Application No. 61/360,817, filed on Jul. 1, 2010, both incorporated herein by reference in their entireties.

FIELD OF THE INVENTION

Embodiments of the present invention relate to systems and methods for encoding and decoding data.

BACKGROUND OF THE INVENTION

The density of data stored in nonvolatile memory modules has dramatically increased during the last decade. This increase in density may cause a reduction in storage reliability and an increase in storage errors. To compensate for the increase in storage errors, memory modules may use error correcting codes (ECC) with increased complexity. However, such an increase in the complexity of the ECC codes may degrade the efficiency and throughput of retrieving data from the memory modules.

Furthermore, current system standards require significantly higher reliability in data retrieved from nonvolatile memory modules, such as flash memory, than from other data communication channels, such as telecommunication transmissions. In telecommunication networks, when an encoding error occurs in a signal, there are protocols to correct the error other than in-code error correction, such as, retransmission protocols that re-send signals. However, since original source data is generally inaccessible to a device accessing flash memory, retransmission may be impractical. Since the flash memory may rely solely on in-code error correction, such as ECC, system standards may allow a significantly smaller probability of error, e.g., on the order of $10_{15}$ in flash memory output streams, than the allowable probability of error, e.g., on the order of $10^{-2}$ or $10^{-3}$, in communication transmissions.

There is a growing need in the art for efficient systems and methods for encoding and decoding that protect the information stored in memory modules from error.

SUMMARY OF THE INVENTION

A system and method is provided for using a cyclic redundancy check (CRC) to evaluate error corrections. A set of data and initial CRC values associated therewith may be received. The set of data by changing a sub-set of the data may be corrected. Intermediate CRC values may be computed for the entire uncorrected set of data in parallel with said correcting. Supplemental CRC values may be computed for only the sub-set of changed data after said correcting. The intermediate and supplemental CRC values may be combined to generate CRC values for the entire corrected set of data. The validity of the corrected set of data may be evaluated by comparing the combined CRC values with the initial CRC values.

A system and method is provided for decoding. Data may be received encoded by a component codeword configured to correct up to a maximum number of errors (q) in the data. At a decoder configured to correct up to a maximum number of errors (r) in the data, an error locator polynomial (ELP) of a predetermined order (r) may be generated that defines the locations in the component codeword of up to (r) errors. If the maximum number of errors (q) that the component codeword is configured to correct is equal to the predetermined order (r), the ELP may include (r) roots corresponding to up to (r) errors to be corrected by the component codeword. However, if the maximum number of errors (q) that the component codeword is configured to correct is less than the predetermined order (r), the ELP may include (q) roots corresponding to up to (q) errors to be corrected by the component codeword and (r-q) virtual roots added to generate the ELP of the predetermined order (r). Up to (q) errors may be corrected at locations in the component code defined by the (q) roots of the ELP

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

Figure 1:
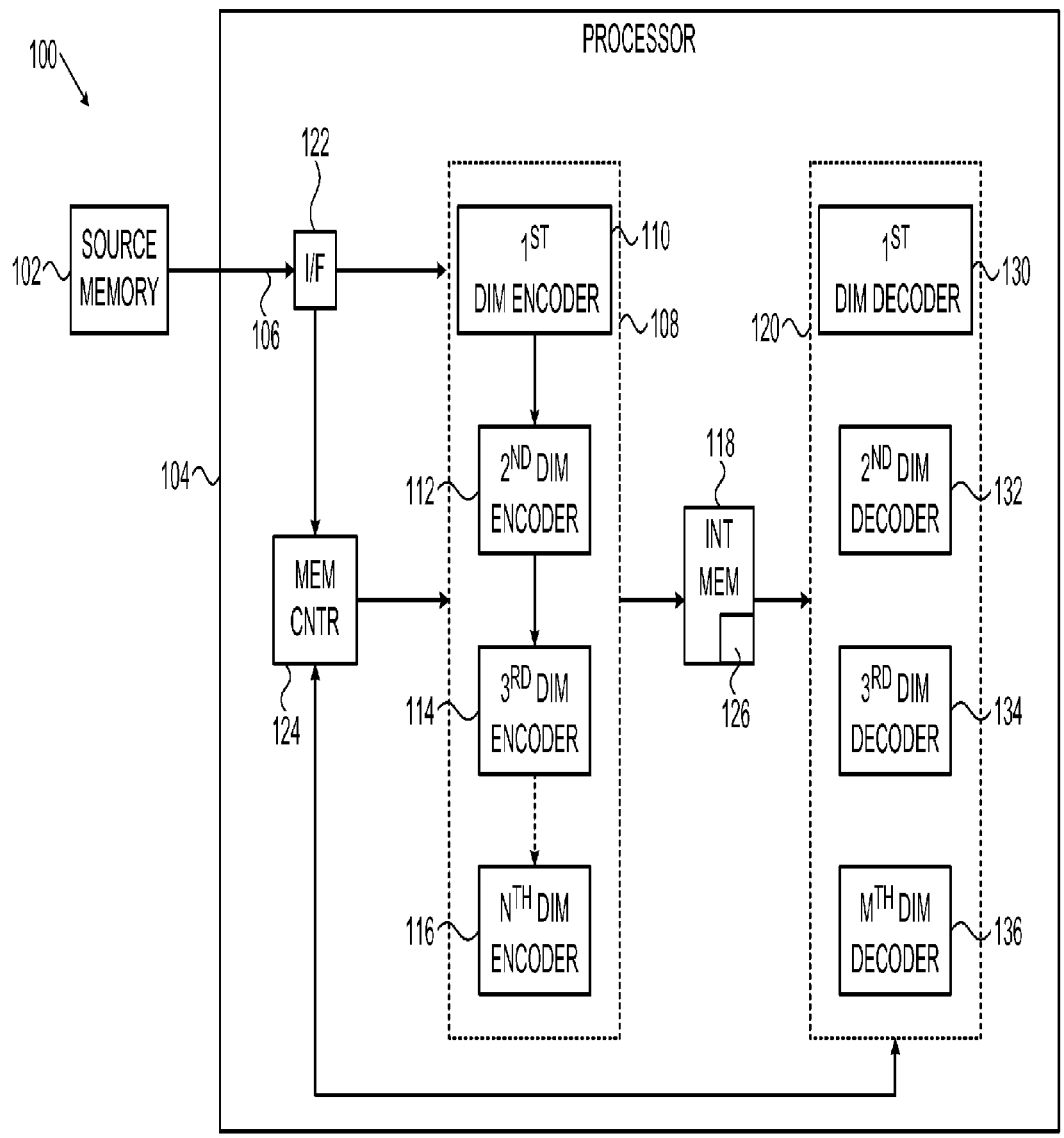
FIG. 1 schematically illustrates a system for encoding and decoding including an encoder and a decoder according to an embodiment of the invention.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

DETAILED DESCRIPTION OF THE INVENTION

In the following description, various aspects of the present invention will be described. For purposes of explanation, specific configurations and details are set forth in order to provide a thorough understanding of the present invention. However, it will also be apparent to one skilled in the art that the present invention may be practiced without the specific details presented herein. Furthermore, well known features may be omitted or simplified in order not to obscure the present invention.

Unless specifically stated otherwise, as apparent from the following discussions, it is appreciated that throughout the specification discussions utilizing terms such as "processing," "computing," "calculating," "determining," or the like, refer to the action and/or processes of a computer or computing system, or similar electronic computing device, that manipulates and/or transforms data represented as physical, such as electronic, quantities within the computing system's registers and/or memories into other data similarly represented as physical quantities within the computing system's memories, registers or other such information storage, transmission or display devices.

An encoder may encode input data. The input data may be arranged in a bit stream and grouped into segments or codewords. The input data may be encoded multiple times in multiple dimensions, as a set of multi-dimensional encoded data. A set of multi-dimensional data may encode the input data such that each different dimension provides a different encoding of the same or overlapping data. The multi-dimensional encoder may generate each dimension by applying different component codes to different arrangements or permutations of the same or overlapping data. For example, to encode a first dimension of the data, the encoder may apply a first sequence of component codes, for example, to a first sequence of order of the input data. To encode each subsequent second or greater dimension of the data, the encoder may permute, re-arrange or "fold" data input into or output from the first or previous dimensional encoding and encode the data with different component codes. For example, a 2D array of rows of data encoded in a first dimension may be folded (e.g., rotated or transposed) into columns of data and encoded in a second dimension, although any permutation of input bits may be used.

Once the input data is encoded, the encoded data may be stored, for example, in a flash memory, read from storage, and/or decoded. Due to the nature of Flash devices, a read or store operation to the Flash device may introduce errors to the data. To correct potential errors, the multi-dimensional encoded data may be decoded to jointly correct more errors together in the multiple encoding dimensions than may be correct in a single encoding dimension alone. In some embodiments, additional code may be used to encode parity bits, which may be decoded, for example, in each dimension, to provide additional error correction data.

In conventional decoding systems, a decoder may decode an entire data stream or stream segment in each decoding iteration. In some cases after one or more decoding iterations, some stream segments may be completely corrected, while other stream segments may still have errors.

To increase decoder efficiency, after one or more iterations of decoding an entire data stream, if errors persist for a subset of input bits in the stream (e.g., unsolved component codes), a decoder may locate an "intersection" of the multi-dimensional data. An intersection of an input bit may include a set of encoded data bits encoding the same input bit by different component codes in each different dimension. For example, the intersection of a 3D code $S_{bits}$ may be a set of data bit locations in component codes $C_{1,i}$ and $C_{2,j}$ and $C_{3,k}$, where $C_{x,y}$ is the x-th dimension and y-th component code. If component codes in multiple dimensions are unsolved, then the intersection bits which reappear in multiple unsolved component codes may have a high probability of encoding errors.

These high error probability intersection bits may be corrected, for example, by generating a plurality of correction hypotheses for correcting the common intersection bits, ordering or enumerating the hypotheses and attempting to decode all or some of the associated component codes (each in a different dimension) for each hypothesis until a decoding success is detected and the component codes are solved. A decoding success may occur for a hypothesis when decoding component codes using the hypothesis generates a reduced, optimal or threshold error metric therefore in some or all encoding dimensions (or after enumeration of all hypotheses). In one example, each hypothesis may flip a different input bit, each having corresponding intersection bits in multiple unsolved component codes. After each bit flip, the corresponding component codes may be decoded. If a sufficient number of the component codes are successfully decoded in the multiple dimensions, the flipped bits may be applied to the associated input bits.

Mapping intersection bits in multiple encoding dimensions that encode the same input bits and testing error hypotheses for those bits in the multiple dimensions may increase the error correction capability of the associated component codes, thereby providing a more efficient decoder. Embodiments of the invention for decoding intersections may be adapted from or combined with embodiments described in U.S. patent application Ser. No. 13/036,796, filed Feb. 28, 2011.

Since input bits are typically rearranged or permuted to generate encoding components in each dimension, during intersections decoding the decoder may first have to locate the intersection bits that encode the same set of input bits in different encoded dimensions. Some systems may locate the intersection bits associated with each individual input bit by evaluating all possible combinations of correspondences between the entire sets of intersection bits in each encoding dimension. The decoder may select the "best-fit" correspondences that minimize the cumulative bit value differences between the complete sets of intersection bits. Accordingly, locating the intersection bits corresponding to each individual input bit may depend on locating the intersection bits corresponding to all other input bits in the input set. Such systems may locate intersection bits for all input bits in the set (in a first pass) before decoding even a single input bit in the set (in a second pass).

In contrast, some embodiments of the invention may locate intersection bits for one or more target input bits "on-the-fly" (in a single decoding pass), independently for each individual input bit. Accordingly, if errors persist (e.g., one or more component codes are unsolved), the decoder may immediately proceed to locate and decode the intersection bits encoding each input bits in multiple unsolved component codes.

To identify the location of intersection bits on-the-fly or in a single pass, embodiments of the invention may include a map or transformation defining the correspondences between input bits and their intersection bits in each dimension. In one embodiment, the intersection map may define, for each input bit, a correspondence between intersection bit(s) in different component codes for each different dimension of the multi-dimensional encoded data. The intersection map may also indicate an error measure for the corresponding component code in each dimension (e.g., a non-zero syndrome calculation (1) indicating an unsolved or potentially erroneous component code) or (e.g., a syndrome calculation of zero (0) indicating a solved component code).

The decoder may use the map to locate intersections to provide a subset of associated input bits, which are likely to contain error(s). In one embodiment, the decoder may decode input bits sequentially, where for each input bit, the decoder may use the map to locate all unsolved component codes encoding the input bit in different dimensions (e.g., component codes having a non-zero sum of the syndrome calculations for the bits). In another embodiment, the decoder may search for unsolved component codes in the multi-dimensional encoded data and may use the map to locate common bits encoded by multiple unsolved component codes in multiple dimensions. These intersection bits that reappear in multiple unsolved component codes may have a high probability of error and may be flipped in a candidate error correction hypothesis.

The decoder may correct or solve the unsolved component codes by generating and testing a plurality of candidate error correction hypotheses, each flipping intersection bits in the multiple unsolved component codes. The decoder may successfully correct the input bits by applying the hypothesis with an error or likelihood metric that is greatest and/or that satisfies a threshold condition. For example, a candidate error correction may be accepted if at least a predetermined number, K, of associated component decoders may successfully decode their codeword (e.g., find a solution with a zero syndrome calculation) each in a different dimension of an N-dimensional code, where K≤N and K is an encoding parameter.

The intersections map may instantaneously provide the locations of all intersection bits in the multi-dimensional encoded data associated with each input bit, for example, as the data is decoded, without having to enumerate over multiple location hypotheses to compute the intersections locations. In some embodiments, intersection maps with simple one-to-one correspondences may be used to locate intersection bits in each encoding dimension for single bit errors (e.g., each individual input bit may be mapped to a single intersection bit in each encoding dimension). In other embodiments, more complex maps may be used to locate intersection bits for multiple bit errors (e.g., each combination of k input bits in a sequence of length n bits may be mapped to n choose k different combinations of possible locations). For single bit errors, the decoder may evaluate each input bit, one-at-a-time, by using the intersection map to locate the single associated intersection bit location in a component code in each different dimension (if there exists intersection bit(s) for that input bit), flip the intersection bit, and recompute an error metric (e.g., syndrome calculation) for the updated component code. When an error metric indicates a flip of an intersection bit corrects an error or solves and unsolved component code (e.g., the associated syndrome values are updated from (1) to (0)), the updated bit value may be applied to correct the associated input bits of the input stream.

Embodiments of the invention may provide a mechanism to generate the intersection map for each individual input bit "on-the-fly," for example, while decoding that bit. In one embodiment, a plurality of (e.g., N) parallel threads (e.g., hardware or software implemented), each operating in a different encoding dimension, may be used to generate the (N) dimensional map. In one embodiment, each thread may map an input bit index or location to a corresponding intersection bit index or location in a different one of the (N) multiple dimensions of the multi-dimensional encoded data and detect the error associated with those intersection bits in the associated dimension. Each thread may generate the map and detect an error or unsolved component codes for each input bit in a single clock cycle or processor pipeline for efficient intersections decoding.

In some embodiments, when there is uncertainty in the input data, instead of generating a single error correction, decoders may generate a plurality of "hypotheses" of potential error correction candidates from which to choose. The plurality of hypotheses may represent different combinations of potential error corrections and may be used for, for example, intersections decoding (using a hard decoder) or soft decoding. A hard decoder may define each bit to have an exact and definite value, for example, either a one or a zero. However, when the number of errors exceeds the component code capability for correcting those errors, intersections decoding may generate a plurality of hypotheses or "candidates" to correct the excess errors and test such hypotheses using the associated intersection bits of the encoded data. In soft decoding, input bits include not only a 1 or 0 (hard bit information) but also a measure of the certainty or probability that the bit value is valid or correct (soft bit information). Since the input bits are uncertain, so too are their corrections. For a codeword of k information bits, the possible bit values (for binary (0) or (1) bits) is $2^k$. Each of the ($2^k$) combinations of different bit values may be a hypothesis or potential "candidate" error correction for the codeword.

In some embodiments, a decoder may generate the plurality of error correction hypotheses (e.g., for intersections decoding or soft decoding), such that, each hypothesis defines a different bit flip or error correction, for all possible combinations of potential error corrections. The decoder may compute a reliability probability or metric associated with each hypothesis and may order or enumerate the hypotheses accordingly. Once all the hypotheses are generated and enumerated, the decoder may decode the associated component code using each hypothesis correction in order of the hypothesis enumeration, for example, until the component codes are successfully decoded. Such systems may use two separate passes, one to generate all possible error correction hypotheses and another to decode the component codes according to each of the hypotheses.

In contrast, instead of generating all the error correction hypotheses before beginning to decode with those hypotheses (in two separate passes), some embodiments of the invention may implement "on-the-fly" enumeration of hypotheses, for example, generating and decoding each individual hypothesis independently of (or without waiting for generating) other hypotheses. In one embodiment, a decoder may generate and decode each error correction hypothesis, in turn (one-by-one), before proceeding to generate the next sequential hypothesis. A component code soft decoder may declare a decoding success when, after passing over a full list or subset of hypotheses, using the most likely hypothesis and/or when the reliability metric of a solution satisfies a threshold condition. If decoding succeeds before advancing to the final hypothesis, only a subset of all possible hypotheses may be evaluated, thereby saving decoder resources.

Furthermore, embodiments of the invention may generate the sequence of hypotheses in order of the probability or likelihood of accuracy defined by a reliability metric associated with each hypothesis, for example, from the most likely hypothesis to the lowest likelihood hypothesis. The reliability metric may be, for example, a sum of absolute values of the associated log-likelihood ratio |LLR| of the component codes (sum-|LLR|) or any other measure of likelihood or reliability. |LLR| and sum-|LLR| may define the reliability of the bit(s), such that, a higher |LLR| may indicate a more reliable bit and a smaller the |LLR| may indicate a less reliable bit (e.g., |LLR|=0 may indicate the bit has equal (0.5) probability of being a 0 or 1). The most likely candidates for correcting bits with the highest probability of success may flip bits with the lowest reliability (lowest sum-|LLR|).

Ordering or enumerating the hypotheses according to their associated reliability metrics is typically a prohibitively complex operation in conventional systems (e.g., an unbounded partial sum ordering having a complexity that grows exponentially with the number of information bits per codeword). To enumerate or order the hypotheses with a reduced (e.g., linear) complexity, a decoder operating according to embodiments of the invention may rescale the associated reliability metric for each hypothesis, for example, to values along a uniform, linear or equally spaced scale. The scaled reliability metrics may be enumerated in linear time, for example, ordered monotonically from the most likely hypothesis to the least likely hypothesis (e.g., lowest to highest sum-|LLR|). Since the hypotheses may be ordered with linear complexity, each sequential hypothesis may be generated in order, for example, on-the-fly, with no additional ordering step.

Since the hypotheses are generated from the most likely hypothesis to the least likely hypothesis, hypotheses with a relatively high likelihood of accuracy (e.g., a relatively small sum-|LLR|) may be evaluated before hypotheses with a relatively low likelihood of accuracy (e.g., a relatively high sum-|LLR|). Since hypotheses generated in an earlier turn have a higher likelihood of being correct, the decoding process has a statistically higher probability of succeeding and ending earlier rather than later, for example, after evaluating only a subset of all possible hypotheses. Such systems may significantly improve decoder efficiency by using fewer hypotheses compared to other systems, which generate, evaluate and store hypotheses for all possible combinations of potential error corrections.

Some systems may use a cyclic redundancy check (CRC) to validate the integrity of data. In one example, a read operation to a Flash memory device may introduce errors to the original data. The original data may be encoded such that any accumulated errors may be identified and corrected by decoding. However, when the data is decoded with insufficiently reliability, a CRC may be used to validate the corrections (e.g., or conversely, to indicate false corrections). CRC data may be a "signature" or derivation of an entire set of input bits, e.g., a component code or "packet." The signature may be concatenated (e.g., merged) with the input bits and the concatenated data may be encoded. To verify the decoded input data, the associated decoded CRC data may be compared to the original signature of the input bits.

In conventional systems, since the entire set of CRC data may be generated together for the entire set of input bits, each correction or single input bit flipped during the decoding process may cause the decoder to recalculate the entire set of CRC data for all the input bits. In one example, to evaluate flipping a sequence of (k) input bits, conventional systems may use (k) clock cycles. Accordingly, as the number of (k) input bits grows, the number of (k) clock cycles needed to evaluate the CRC data for the input bits may also grow, slowing the error detection mechanism.

In contrast, instead of recalculating the entire set of CRC data for each correction or flipped bit, embodiments of the invention may calculate only the difference in the CRC data resulting from the correction. Computing the CRC difference value resulting from a single bit flip may use a single clock cycle, a significant reduction from the (k) clock cycles used in conventional systems. In general, computing the CRC difference value for correcting any number of (p) bits in the (k)-bit sequence may use (p) clock cycles, a reduction of (k-p) clock cycles compared with conventional systems.

In conventional systems, each hardware encoder/decoder may encode/decode component codes that corrects up to a certain maximum number of (q) errors according to the component code configuration. In some systems, decoding a component code, such as a BCH code, may include the following steps: (1) calculate the error syndromes of the code (e.g., defining error), (2) derive an error locator polynomial (ELP) using the calculated error syndromes, (3) solve the ELP by determining its roots to define the locations of the errors in the component code and (4) correct the errors at the calculated error locations in the component code. In conventional systems, each decoding engine may solve an ELP of a specific degree or power (or with a specific number of roots) and may thus, be used to locate and correct up to a specific maximum number of errors. Conventional systems use different component codes and different associated decoder hardware to correct component codes configured for solving each different maximal error count (e.g., separate hardware for codes correcting up to 2 bit errors and codes correcting up to 3 bit errors). Storing and managing multiple sets of component codes and decoder hardware for each different code configuration may use significant system overhead. For example, the gate count or number of logic units used to implement a configurable encoder/decoder with different capabilities may be relatively high if separate logic units are used for each code configuration.

To reduce system overhead and gate count, embodiments of the invention may reuse component codes and decoder hardware to correct data with multiple different error count code configurations. For example, decoder hardware may be used to decode codes configured to correct up to a first maximum number (q) of errors (e.g., solving ELPs for q=3) and may also be adapted to decode codes configured to correct up to a second smaller maximum number (r) of errors (e.g., solving ELPs for r=2). In one embodiment, to adapt the same hardware to solve ELPs with a smaller maximum number of roots (correcting up to a smaller number of errors), an extra "virtual root" may be added to convert the ELP to a higher degree solvable by the hardware. The converted higher degree ELP may be solved by the higher order hardware to generate the actual roots (of the original ELP) as well as the virtual root(s) (of only the higher order ELP). The virtual root may indicate one or more known location(s) and may thus be differentiated from the actual roots and ignored. In one embodiment, the component code may be extended (e.g., by a single bit or a sequence of multiple bits) at a predefined location, for example, appended at the end of the component code. The virtual root may always indicate the predefined extended location, while an actual root may never indicate the predefined extended location, thereby avoiding confusion between actual and virtual error locations.

Embodiments of the invention may decrease system gate count by using the same type of hardware encoder/decoder to encode/decode component codes of different configurations (e.g., configured by software) for different maximal error counts. When a single type of hardware is used for all component code configurations, the codes may be indiscriminately input into the next available encoder/decoder without management of differently configured decoders for on-the-fly decoding, thereby significantly reducing system overhead associated with selecting the appropriate hardware for decoding.

Embodiments directed to locating intersection bits on-the-fly using a map, generating the map on-the-fly, and/or decoding on-the-fly may be combined to evaluate and decode each sequential input bit in an input set, on-the-fly, in a single sequential clock cycle or pipeline stage. It may be appreciated that processing each input bit in a single clock cycle may occur over a sequence of a plurality of computational cycles using a plurality of processor units (e.g., arithmetic logic units (ALU), fetch units, decode units, etc.), such that each unit may only process data for each input bit for a single computational cycle.

Reference is made to FIG. 1, which schematically illustrates a system 100 for encoding and decoding including an encoder 108 and a decoder 120 according to an embodiment of the invention.

System 100 may include a computer device capable of executing a series of instructions to write, read, modify, erase, store, save, recover, process, encode, decode, compute, edit, map, receive, transfer, display, or otherwise use or manipulate data. System 100 may include one or more computers, workstations, cellular device, tablet devices, personal digital assistants (PDA), video game consoles, etc. In one embodiment, system 100 may be a computer with a flash memory, secure digital (SD) card or disk drive.

System 100 may include a source memory 102 and an internal memory 118. Source memory 102 may include, for example, a non-volatile memory, a flash memory, one or more external drives, such as, a disk or tape drive, a graphics card, an input/output device port, a network card or an external memory in an internal or external device. Internal memory 118 may include, for example, volatile memory, random access memory (RAM), dynamic RAM (DRAM), cache memory, buffer memory, scratchpad memory, or other suitable memory units or storage units for direct use by a processor 104. In one embodiment, internal memory 118 may be a volatile or short-term memory unit, while source memory 102 may be a non-volatile or long-term memory unit; however, either of these memories may be volatile or non-volatile and may be used for long-term or short-term storage.

System 100 may include a processor 104 to request data, for example, via a program interface 122 and/or input port, from a source memory 102 to internal memory 118. Processor 104 may include a control module 124 having erasing, writing and reading circuitry to transfer the data as an input stream 106.

Processor 104 may transfer input stream 106 to encoder 108. Encoder 108 may include multiple encoders 110, 112, 114, . . . , 116 to provide multiple different encoded versions of the same or overlapping data (or encoded versions thereof) from input stream 106. Encoders 110-116 may be dedicated hardware units, or processor 104 executing software. A first encoder 110 may encode the original input stream 106, for example, including the original data retrieved from source memory 102, and may output a sequence of encoded codewords. The output of first encoder 110 may be stored in internal memory 118 as a linear (1D) sequence of encoded bits. A second ($2^{nd}$) encoder 112 may encode a folded version of the output stream of first encoder 110, a third ($3^{rd}$) encoder 114 may encode a folded version of the output stream of second encoder 112, a fourth ($4^{th}$) encoder may encode a folded version of the output stream of third encoder 114, and so on until an ultimate ($N^{th}$) encoder 116 may encode a folded version of the output stream of the penultimate (($N-1)^{th}$) encoder. The encoders are thus ordered. The cumulative output of the multiple encoders 110-116 may be multi (N)-dimensional encoded data. The multi-dimensional encoded data may include one or more data streams encoding each of a plurality of input bits multiple times in multiple different dimensions. Multi-dimensional encoded data may be used according to embodiments described in U.S. patent application Ser. No. 13/036,796, filed Feb. 28, 2011.

Encoding may be executed by encoders 110-116 using a linear feedback shift register through which the data (e.g., systematic data) is passed. Systematic data may pass through each encoder 110-116 without being modified while the linear feedback shift-register of the encoder 110-116 advances. The output of the linear feedback shift register may be redundancy bits of the passing code and may be appended to the output data stream. In other embodiments, the bits of input stream 106 may be changed to encoded versions thereof by 110-116. In some embodiments, a bit may refer to the smallest data unit that may be individually processed, which may be a single bit (e.g., in a single level cell memory) or a plurality of (N)-bits (e.g., 8 or 16 bits in a multi (N)-level cell memory) that encoders 110-116 may encode at a time.

The output of each encoder 110-116 may be an output stream, which is essentially a shifted version of the input stream with redundancy information. Encoders 110-116 may encode data streams "on the fly" such that, for example, an N+1-dimensional encoder may encode the streaming output of the N-dimensional encoder as it passes onto the N+1 encoder. Therefore, encoding in all dimensions may have minimal latencies.

Once the multi (N)-dimensional encoded data is generated, the data may be stored in internal memory 118. Processor 104 may receive a program or instruction requesting data from source memory 102. Processor 104 or memory controller 124 may transfer the corresponding multi-dimensional encoded data from the corresponding location in internal memory 118, for example, where the data is readily accessible to the processor. Decoder 120 may decode the multi-dimensional encoded data by soft or hard decoding. Decoder 120 may include multiple decoders 130, 132, 134, . . . , 136 to independently decode data in each of the multiple different encoding dimensions. Decoder 120 may be a dedicated hardware unit, or processor 104 executing software.

When hard decoding, a first decoder 130 may decode data encoding the entire input stream 106, for example, correcting errors in a first decoding pass. If a potential encoding error is detected for a subset of input bits in input stream 106 (e.g., the subset is encoded by unsolved component codes), instead of repeatedly decoding an encoded version of the entire input stream 106, decoders 132-136 may locate sets of intersection bits in the multi-dimensional encoded data, where the intersection bits are associated with unsolved component codes in each dimension and thus, have a high probability of having error.

Decoders 132-136 may locate the intersection bits in the multiple unsolved component codes, on-the-fly, by using a transformation or map 126. Map 126 may define correspondences between intersection bits in multiple different dimensions that encode the same or overlapping input bits in the input stream 106. Map 126 may also define error measures (e.g., syndromes) for the component codes in each dimension, for example, to quickly identify if the component codes are solved (e.g., 0) or unsolved (e.g., 1). In some embodiments, map 126 may include a function or a look-up-table listing entries defining correspondences between intersection bits and/or associated error metrics for each input bit.

In one embodiment, the decoder may scan map 126 for unsolved component codes (e.g., with error metrics of 1) in multiple dimensions and identify associated intersection bits encoding the same input bit. In another embodiment, each individual input bit in the input subset may be evaluated sequentially (e.g., in order of the bit index in the input stream 106). For each sequential input bit, decoders 132-136 may use map 126 to locate corresponding intersection bits in each of one or more multiple encoding dimensions and determine, for example, using the associated error metrics, if the intersection bits are located in multiple unsolved component codes. If map 126 links intersection bits in multiple unsolved component codes, decoders 132-136 may attempt to solve the multiple unsolved component codes with an error hypothesis including a new set of intersection bits corresponding to a flipped input bit. Decoders 132-136 may re-calculate the error metric associated with the component codes (containing the flipped bits) in each of the multiple encoding dimension(s). If the re-calculated error metric (with the flipped bit) is less than the original error measure from map 126 (with the un-flipped bit) in at least one, a majority, or all of the dimensions, the hypothesis may be correct and may be applied to correct the associated input bits in the original input stream 106. However, if the error metric is increased or remains constant, the hypothesis may be incorrect and the flipped bit may be returned to its un-flipped state and decoders 132-136 may proceed sequentially to evaluate the next sequential hypothesis to flip the next input bit in the input subset. Decoders 132-136 may continue sequentially until the error measure of intersection bits in the multiple encoding dimensions is reduced, for example, by a single error bit, to zero, or to below a predetermined error threshold.

In one embodiment, map 126 may be generated prior to decoding the multi-dimensional encoded data, so that when the multi-dimensional encoded data is decoded, decoder 120 may instantaneously locate the intersection bits in the multiple encoding dimensions by reading map 126 corresponding to the bits of the input subset. In another embodiment, map 126 may be generated for each sequential individual input bit in the input subset, on-the-fly, while decoding the individual input bit. Map 126 may be generated on-the-fly for each input bit using the plurality of (M) decoders 132-136, where each decoder may locate a corresponding encoded bit for the individual input bit in a different one of the (N) dimensions of encoded data. Decoders 132-136 may execute the plurality of (M) processing threads in parallel to generate map 126 from each individual input bit in the potentially erroneous subset to all (N) encoded bits in the corresponding intersection in a single clock cycle (e.g., when N=M).

Figure 2:
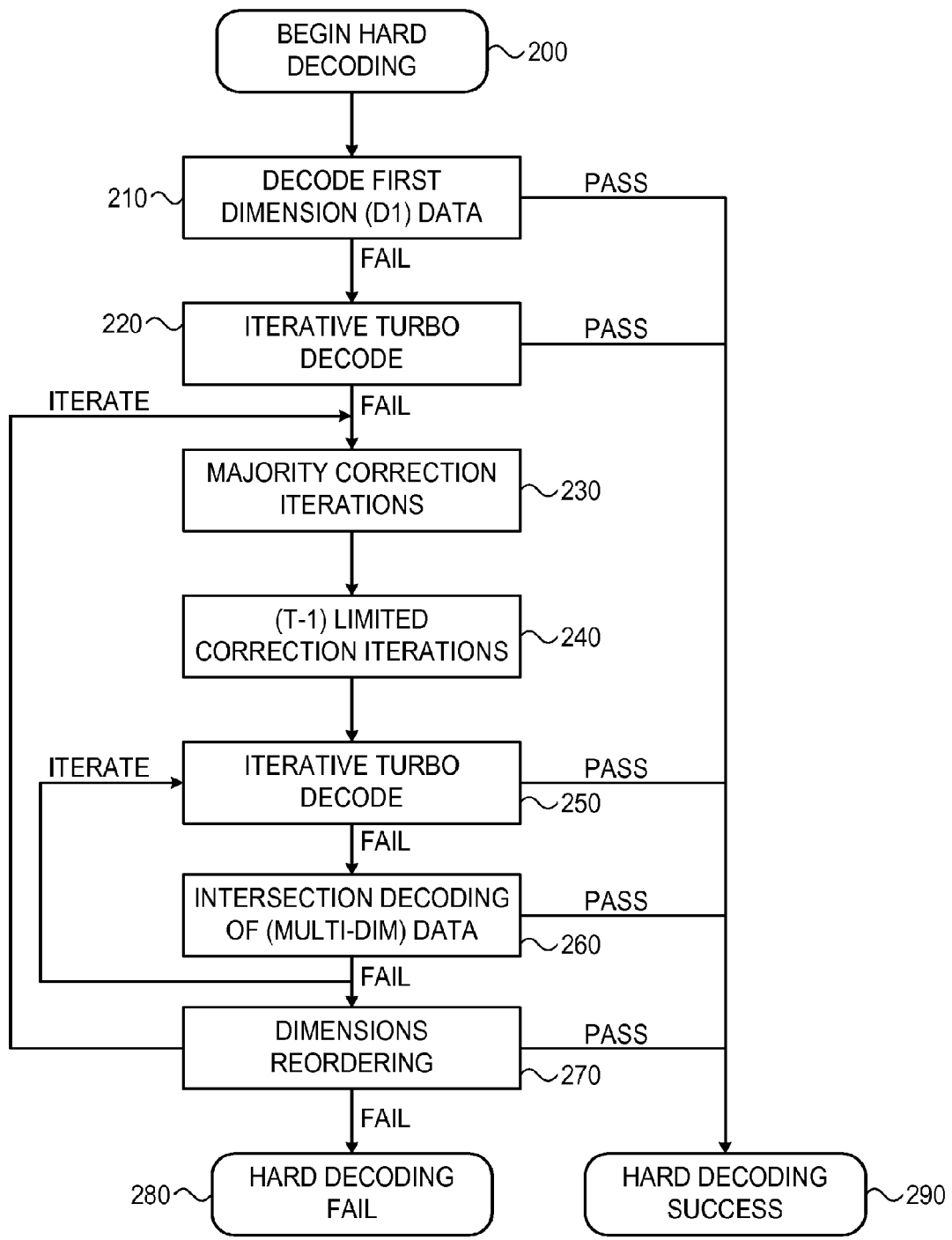
FIG. 2 is a flowchart of a method for iteratively hard decoding multi-dimensional encoded data using intersection decoding according to an embodiment of the invention.

In some embodiments, intersection decoding may be used to decode select sub-segments of a data stream where errors are determined to be likely and may supplement other decoding operation that decode over the entire length of the data stream, for example, as described in reference to FIG. 2. Decoding the intersection bits for a component code may increase the error correction capability of the component code beyond its natural capability. That is, for a component code which corrects up to t=3 errors, intersections decoding may correct t>3 errors per component. This is obtained by enumerating different bit-flips for suspected bits. For 3D codes, the size of such intersections is small enough to provide low complexity enumerations. The intersection bits may each be tested for each enumerated candidate or hypothesis bits to correct one or more error bit(s). Each candidate error bit(s) may be tested by flipping the bit(s) and evaluating whether or not the associated error measure for the candidate bit(s) decreases (correcting the error), increases (creating a new error), or remains constant (replacing one error with another).

Reference is made to FIG. 2, which is a flowchart of a method for iteratively hard decoding multi-dimensional encoded data using intersection decoding according to an embodiment of the invention.

In operation 200, a decoder (e.g., decoder 120 of FIG. 1) may initiate a hard decoding process on a set of multi-dimensional codes encoding a set of input bits multiple times using different arrangements of input bits and different component codes in each of multiple different encoding dimensions.

In operation 210, the decoder may decode a first dimensional (D1) version encoding an entire data stream. If decoding the first dimensional (D1) version is successful, for example, where all or an above threshold number of errors of the input bits are corrected by the first dimension component codes, the decoding process may proceed to operation 290 and end without further decoding iterations. However, if decoding the first dimensional (D1) version fails, for example, some component decoder indicates a miss-correction, the decoding process may proceed to any or all of subsequent operations 220-260 for further decoding.

In operation 220, the decoder may use an iterative decoder, such as, an "iterative turbo decoder," to decode data bits, for example, generated in operation 210. If the iterative decoder decodes successfully, the decoder may proceed to operation 290. Otherwise a process or decoder may proceed to operation 230.

In operation 230, the decoder may decode bits using majority decision decoding. Majority decision error correction may determine whether or not to modify each bit (e.g., flipping the bit from 0 to 1 or 1 to 0) if a majority of component decoders or more than a certain threshold of decoders in the multiple encoding dimensions suggest the same correction.

In operation 240, the decoder may decode bits using (t−1) limited corrections per component code. The decoder may correct up to a predetermined maximum number of (≤t−1) errors, where the predetermined number is defined by a reliability threshold. The maximum number of errors may be one (1) error less than the code correction capability (t).

Operation 230 (majority decoding) and operation 240 ((t−1)-limited decoding) may each be carried out for respective numbers of iterations, $M_0 > 0$ and $M_1 > 0$. It may be noted that if $M_0 = 0$, there may be no majority decoding iterations and if $M_1 = 0$ there may be no (t−1)-limited decoding iterations. Embodiments of the invention may skip a decoding stage for example for faster decoding.

In operation 250, the decoder may use an iterative decoder to decode bits, for example, generated in operation 230 or 240. If iterative decoder decodes successfully, the decoder may proceed to operation 290. Otherwise, a process or decoder may proceed to operation 260.

In operation 260, if errors persist or component codes remain unsolved for a subset of the input data, the decoder may decode a multi-dimensional encoded version of the data by targeting a set of intersection bits therein encoding the each input bit in the input subset in multiple different dimensions. The intersection bits may be decoded in a single pass of the input subset, either by using a map to instantaneously locate the corresponding intersection bits on-the-fly (e.g., as described in reference to FIGS. 3 and 4), or by enumerating over a plurality of candidate error correction hypotheses on-the-fly, for example, in order of the probabilities of successful corrections (e.g., as described in reference to FIG. 5). Intersection bits may include the set of bits in multiple encoding dimensions, which encode the same or overlapping input bits, such as, a component codeword. The intersection bits may provide multiple encoded versions of the same input bits, which may be decoded to cumulatively correct more errors together than may be corrected in a single dimensional (D1) alone. If the decoder decodes the intersections reliably, the decoder may proceed to operation 290. Otherwise a process or decoder may proceed to operation 250 or 270.

In operation 270, the decoder may reorder the decoded intersection bits, which may be re-arranged in each different dimension (e.g., $1^{st}$, $2^{nd}$, and $3^{rd}$ dimensions, respectively), for example, to standardize the bit order according to the original ordering of the corresponding bits in the original data stream. Dimensions reordering may reset the decoder for further processing, for example, to repeat operations (e.g., 230-270) and/or end with a decoding failure at operation 280 or decoding success at operation 290.

In operation 280, the decoder may fail and may output the erroneous bits, no bits or an error message.

In operation 290, the decoder may succeed, for example, generating corrected bits having a below threshold error level.

The input to the decoder in each decoding operation may include, not only the data to be decoded, but also an initial error metric (e.g., a syndrome calculation) defining the error associated with the data. Each time the decoder changes the data (e.g., by flipping bits), the decoder may also recalculate the error metric for the data and compare the recalculated error metric with the initial or previously calculated error metric to determine the effects of the change. A reduced error metric may indicate a successful correction, while a constant or increased error metric may indicate a failed correction.

To initialize the decoding process, for example, in a first decoding stage, the decoder typically computes initial error metrics of all the initial input data (e.g., an entire input data set), which is typically one of the highest computational stages of the decoding process. Adding extra versions or dimensions of data for multi-dimensional decoding may further increase the number of error evaluations for each extra dimension and thus, may further increase the complexity of the initial error computation stage.

To reduce the computational complexity of computing the error metrics for all initial input data together, embodiments of the invention may implement parallel error computation to distribute the error computation among a plurality of different decoders for each different dimension of data. After the decoding process is "in-process" or already running, each different dimension decoder may re-compute error metrics for a sub-set of changed data (e.g., the altered portion of the entire input data set) to use minimal decoder resources.

Figure 3:
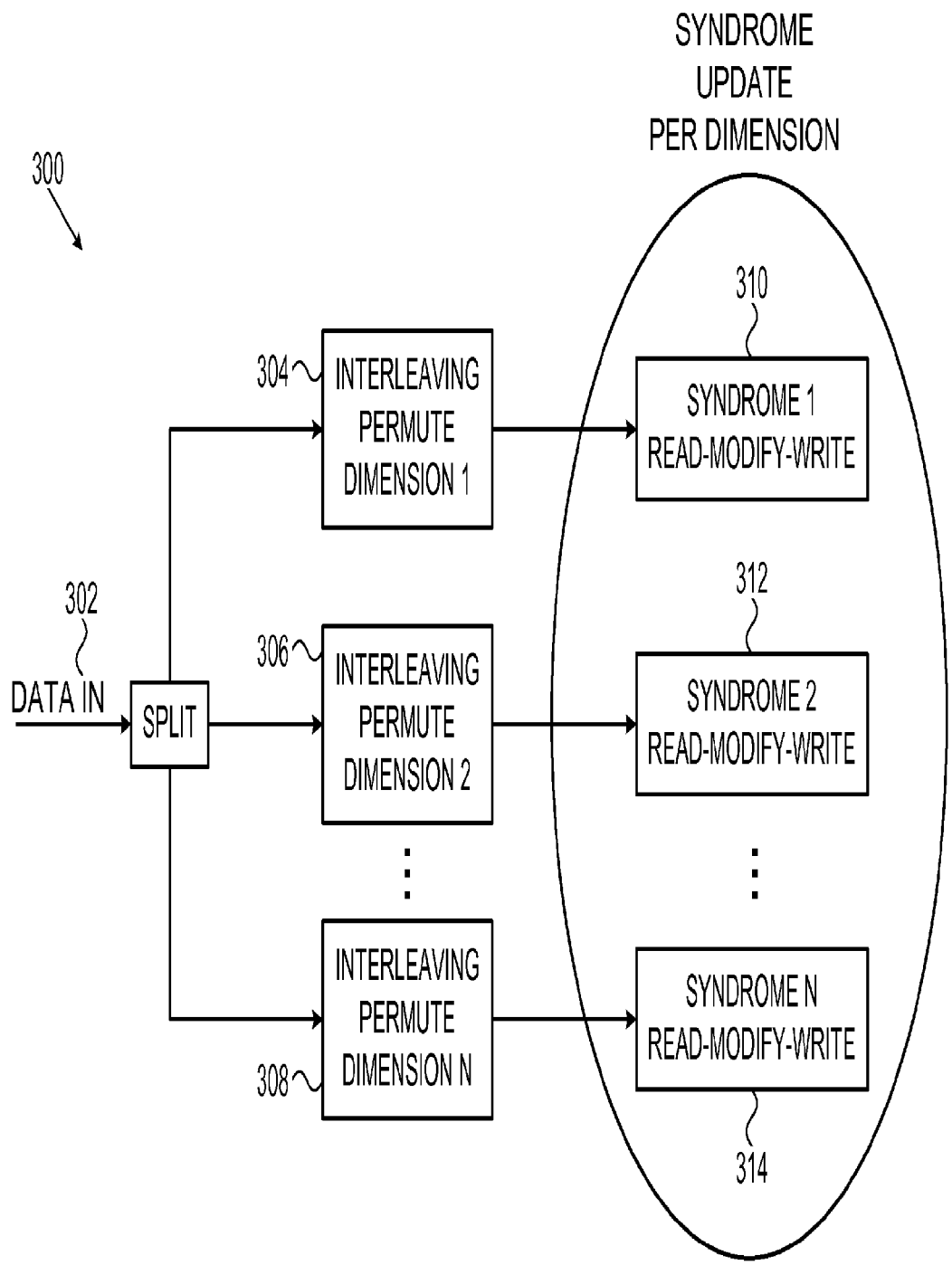
FIG. 3 schematically illustrates the flow of data in a decoding system for parallel error computation in different decoding dimensions according to an embodiment of the invention.

Reference is made to FIG. 3, which schematically illustrates the flow of data in a decoding system 300 for parallel error computation in different decoding dimensions according to an embodiment of the invention.

Decoding system 300 (e.g., decoder 120 of FIG. 1) may receive a set of input data 302 (e.g., input stream 106 of FIG. 1) to decode over plurality of decoding dimensions. The decoder may split input data 302 into a plurality of different copies or datasets 304, 306, . . . , 308 to be decoded by a different decoding unit (e.g., intersection decoders 132-136 of FIG. 1) in each different dimension. Due to the different alignment of data in each dimension, the decoder may interleave or permute input data 302 in each different dimension to generate each different dataset 304, 306, . . . , 308. Datasets 304, 306, . . . , 308 may be input into a plurality of decoding units, each handling a different dimension of data. The plurality of decoding units may compute a plurality of error metrics 310, 312, . . . , 314 (e.g., syndromes) for each dimension, in parallel, for example, to simultaneously evaluate each candidate error correction in the plurality of decoding dimensions. The decoding units may compute the plurality of error metrics 310, 312, . . . , 314 for every error correction in a single clock cycle. In contrast to conventional systems which input entire codewords for each syndrome update, the decoding units operating according to embodiments of the invention may initially compute the error metrics for each bit correction using entire codewords in a first dimension and thereafter translates the syndrome computations for each bit correction in each additional dimension to significantly accelerate computations. By computing error metrics 310, 312, . . . , 314 in parallel, each correction may be evaluated over multiple decoding dimensions with minimal latencies, for example, using a single clock cycle. Error metrics may include syndrome calculations, minimum distance calculations, maximum likelihood calculations, and/or other values indicating error for one or more sets or codewords of data.

Different alignments in each dimension may be used to initially create minimum size intersections between datasets 304, 306, . . . , 308 in different dimensions. If input data 302 has a length of N bits and is split into n0, n1, n2 . . . code packets in each dimension, an ideal interleaving pattern may generate $$\frac{N}{n0 \cdot n1 \cdot n2}$$

bits per intersection. For some code configurations the number of bits per intersection may be sufficiently small to enable different types of enumerations over intersection bits. The number of intersection bits may be reduced after errors are removed by decoding components in one or more initial (D1) dimensions, for example, leaving the decoder with a sufficiently small number of un-decoded components in each extra dimension.

In some embodiments of the inventions, intersection decoding may be used when regular decoding fails to decode input data 302, and there remain a few unsolved code components in each dimension. In such cases, there may be a few component codes with more errors than their correction capability. There is a high probability in the multi-dimensional code structure that errors occur at the intersections between unsolved component codes in different dimensions. Accordingly, intersection decoding may evaluate corrections to those high error probability intersection bits, for example, by enumerate bit-flip hypotheses at each combination of those intersection bits with relatively low complexity. The intersection bits may be decoded, for example, as described in reference to FIG. 4.

As described in reference to FIG. 3, a plurality of decoding units may compute initial error metrics independently and simultaneously (in parallel) for intersection bits in each of multiple different decoding dimensions. The decoding units may also interleave the intersection bits in parallel for the error metric computations. Once the intersection bits are initialized, the bits may be decoded, for example, as described in reference to FIG. 4. In one example, the intersection decoding operations of FIG. 4 may use some of the same or similar operations, in reverse order, as are used in the decoding initialization process of FIG. 3.

Figure 4:
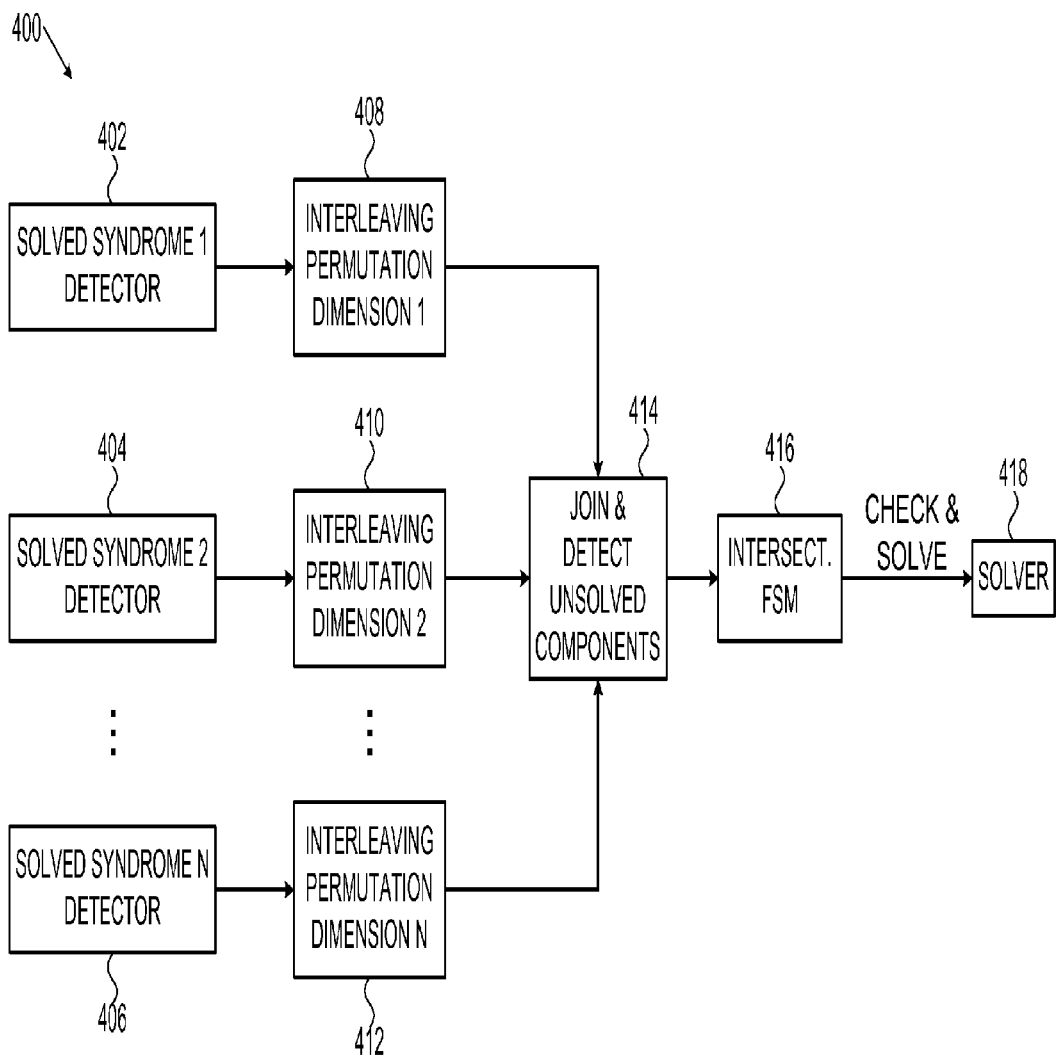
FIG. 4 schematically illustrates the flow of data in a system for decoding intersection bits in parallel in different decoding dimensions according to an embodiment of the invention.

Reference is made to FIG. 4, which schematically illustrates the flow of data in a system 400 for decoding intersection bits in parallel in different decoding dimensions according to an embodiment of the invention.

A plurality of decoders (e.g., intersection decoders 132, 134, . . . , 136 of FIG. 1) may each decode intersection bits in a different one of a plurality of (n) dimensions. Each decoder may initially generate a "dummy" or initialization data stream (e.g., including a sequence of zeros). Each decoder may sign bits that belong to non-solved component codes. The decoders may receive initialized datasets 402, 404, . . . , 406 including multi-dimensional data (e.g., datasets 304, 306, . . . , 308 of FIG. 3) and error metrics (e.g., error metrics 310, 312, . . . , 314 of FIG. 3). The decoders may "permute" or interleave the data, independently in each dimension, to align datasets 408, 410, . . . , 412, to represent data in its original order or arrangement. Dataset 408, 410, . . . , 412 from all dimensions may be joined together in a merged dataset 414, such that, only bits that are signed in all dimensions, remain signed. These signed intersection bits indicate intersections of unsolved component codes from multiple or all the dimensions. These intersection bits may include bits with a high probability of error and may be tested as primary suspects for error.

Intersection bits of un-decoded components may undergo the following evaluation 416, in parallel, in each dimension (e.g., using parallel decoders 132, 134, . . . , 136 of FIG. 1):
 (1) Bit value is flipped,
 (2) Recompute error metrics, and
 (3) Attempt decoding the component with the flipped bit.
In some embodiments, a single intersection bit or a group of intersection bits may be evaluated (e.g., using steps (1)-(3) above) in each decoding iteration (e.g., single clock cycle). Each bit may be examined separately. In some embodiments, a sub-group of the intersection bits may be evaluated. In such cases, all intersection bits of a certain component code may be initially located, but only the sub-group of intersection bits may be evaluated.

A solver 418 may check the validity of the decoding result to determine whether or not to accept and apply each intersection bit flip to correct the original input data, for example, based on parameters programmed into the decoding unit(s), such as, a minimum number of component codes in different dimensions corrected by the bit flip (e.g., recomputing syndrome values from (1) to (0)). In one example, all (n) associated component codes in all multiple dimensions may be corrected to accept a bit flip, while in another example at least one (1) component code in one dimension may be corrected to accept a bit flip. The decision to accept decoder corrections may depend on the decoder architecture, the decoding stage, and previous decoding attempts and results.

In another embodiment, the decoder may replace bit-flips by bit-erasures. That is, instead of solving component codes after every bit-flip, the bit-flip is replaced by erasure, and the component codes are solved for the suspected erasures and additional errors (which can be located outside of the intersection).

Another aspect of a multi-dimensional decoder includes enumerating or ordering hypotheses for different candidate error corrections. When data is decoded with uncertainty, for example, using intersection decoding or soft decoding, a plurality of error correction hypotheses may be generated. These hypotheses may be enumerated and tested in order of their enumeration, from the most probable (maximum likelihood (ML) solution) to the least probable error corrections, to decode successful in the earliest iteration.

For soft decoding, a soft decoder may decode a component code (e.g., also referred to as a "packet") using soft information for each bit. The soft decoder may generate the soft information by performing multiple reads from a source memory, such as, as flash memory, where each read operation uses different read thresholds. The soft decoder may use read thresholds to compute "soft" metrics, such as, log-likelihood ratio (LLR) that define the reliability of the value, for each bit. The log-likelihood ratio (LLR) for a bit (i) may be defined, for example, as follows:

$$LLR(b_i) = \log\left(\frac{P(b_i = 1 \mid y)}{P(b_i = 0 \mid y)}\right)$$

where $b_i$ is the $i^{th}$ bit of some data source and y is the channel output.

Soft decoding may include, for example:

Operation (1): A soft decoder may sort component indices according to a reliability metric of the certainty (reliability/probability) of bit values, for example, from the least reliable to the $N^{th}$ least reliable bit.

Operation: (2) The decoder may determine the enumeration complexity or the maximum number, t, of bits corrected or flipped from the original input bits for each of a plurality of candidate or hypothesis error corrections. The decoder may generate a list of the plurality of hypothesis error corrections for each component code and may order the hypotheses for evaluation. The decoder may map reliability metrics (soft bit values, such as sum-LLR scores) associated with each hypothesis or combination of flipped bits to a uniform finite scale. The reliability metrics arranged in a uniform finite scale, for example, an integer grid, may be simply sorted in a monotonically non-decreasing (e.g., increasing) order. The hypotheses may be ordered according to the order of their associated reliability metrics to create a list of candidates to be decoded in order of their reliability.

Operation (3): The decoder may hard decode each candidate in their order in the list to invert or flip bits according to each candidate error correction's hard bit values.

Operation (4): The decoder may soft decode each candidate in their order in the list, for example, with a valid solution (missCorrection=0). The decoder may compute soft bit information, for example, reliability metrics, such as, the sum of the respective LLR values, for each inverted (flipped) bit (sum-LLR).

Operation (5): The decoder may save a sub-set of valid candidates associated with reliability metrics indicating the highest (or above threshold) probability of being valid or correct, for example, with the lowest sum-LLR (or the candidate list with the lowest sum-LLRs).

In enumeration operation (2), the list of candidate error corrections or hypotheses may be ordered from lowest to highest error probability according to their associated soft bit reliability metrics or scores (e.g., increasing sum(|LLR|)). However, partial sum ordering of reliability metrics for all candidates in the list is typically an NP-complete problem, for example, having prohibitively high implementation complexity. According to an embodiment of the invention, the reliability metrics (e.g., sum-|LLR|) may be mapped, for example, onto a linear, equally spaced, grid. Ordering candidates in the list may be simplified to sorting bounded finite candidate reliability metrics in a monotonic (e.g., non-decreasing) partial sum ordering, which has, for example, a linear time complexity (significantly less complex than the exponential time complexity of conventional systems). Accordingly, embodiment of the invention may order candidates in the list with increased speed, for example, in linear time.

An example of generating an ordered list of candidate error corrections is provided as follows.

The input into the enumerator may be, for example, a set of five candidate bits denoted as A, B, C, D, and E (e.g., enumeration span=5) having the lowest associated LLR values. In the example, three candidate bits have LLR values, LLRval=0, denoted by candidate bits A, B, and C, and two candidate bits have LLRval=1, denoted by candidate bits D, E. Example enumeration computations for the five candidate bits are shown in Table 1:

Example enumeration computations for the five candidate bits are shown in Table 1:

TABLE 1

Enumeration implementation example

| | Candidate Bits Flipped in the Hypotheses Candidate Bits | | | | | |
|---|---|---|---|---|---|---|
| | A | B | C | D | E | |
| | Candidate Reliability Metrics | | | | | |
| Hypothesis No. ↓ | 0 | 0 | 0 | 1 | 1 | Initial LLR Sum ↓ |
| 1 | * | | | | | 0 |
| 2 | | * | | | | |
| 3 | | | * | | | |
| 4 | * | * | | | | 0 |
| 5 | * | | * | | | |
| 6 | | * | * | | | |
| 7 | * | * | * | | | 0 |
| 8 | | | | * | | 1 |
| 9 | | | | | * | |
| 10-16 | All combinations similar to hypotheses 1-7 | | | * | | 1 |
| 17-23 | All combinations similar to hypotheses 1-7 | | | | * | 1 |
| 24 | | | | * | * | 2 |
| 25-31 | All combinations similar to hypotheses 1-7 | | | * | * | 2 |

The example in Table 1 provides the following results:

$$SumLLR = 0 \text{ is obtained by } \binom{3}{1} + \binom{3}{2} + \binom{3}{3} = 7 \text{ hypotheses.}$$

$$SumLLR = 1 \text{ is obtained by } \binom{2}{1} + \binom{2}{1} * 7 = 16 \text{ hypotheses.}$$

$$SumLLR = 2 \text{ is obtained by } \binom{2}{2} + \binom{2}{2} * 7 = 8 \text{ hypotheses.}$$

In total, there are 31 hypotheses, ($2^5$–1), which may be ordered according to the reliability metric associated with each hypothesis, for example, from the lowest to highest reliability metrics (e.g., monotonically non-decreasing or increasing sum-|LLR|). In the soft decoding operations (1)-(5) above, all (e.g., 31) hypotheses may be generate and enumerated (in a first enumeration pass operation (2)) before any of the hypotheses are evaluated (in a second decoding pass operations (3) and (4)). However, waiting for all the hypotheses to be ordered before evaluating any of them may slow down the decoder.

According to some embodiments of the invention, an enumerator may implement "on-the-fly" enumeration of hypotheses, for example, generating, enumerating and decoding each hypothesis together (independently for each hypothesis). Thus, if a hypothesis (other than the last hypothesis) successfully decodes the data, the decoder need not proceed to generate or enumerate the remaining hypotheses in the list, thereby significantly reducing decoding computations.

Figure 5:
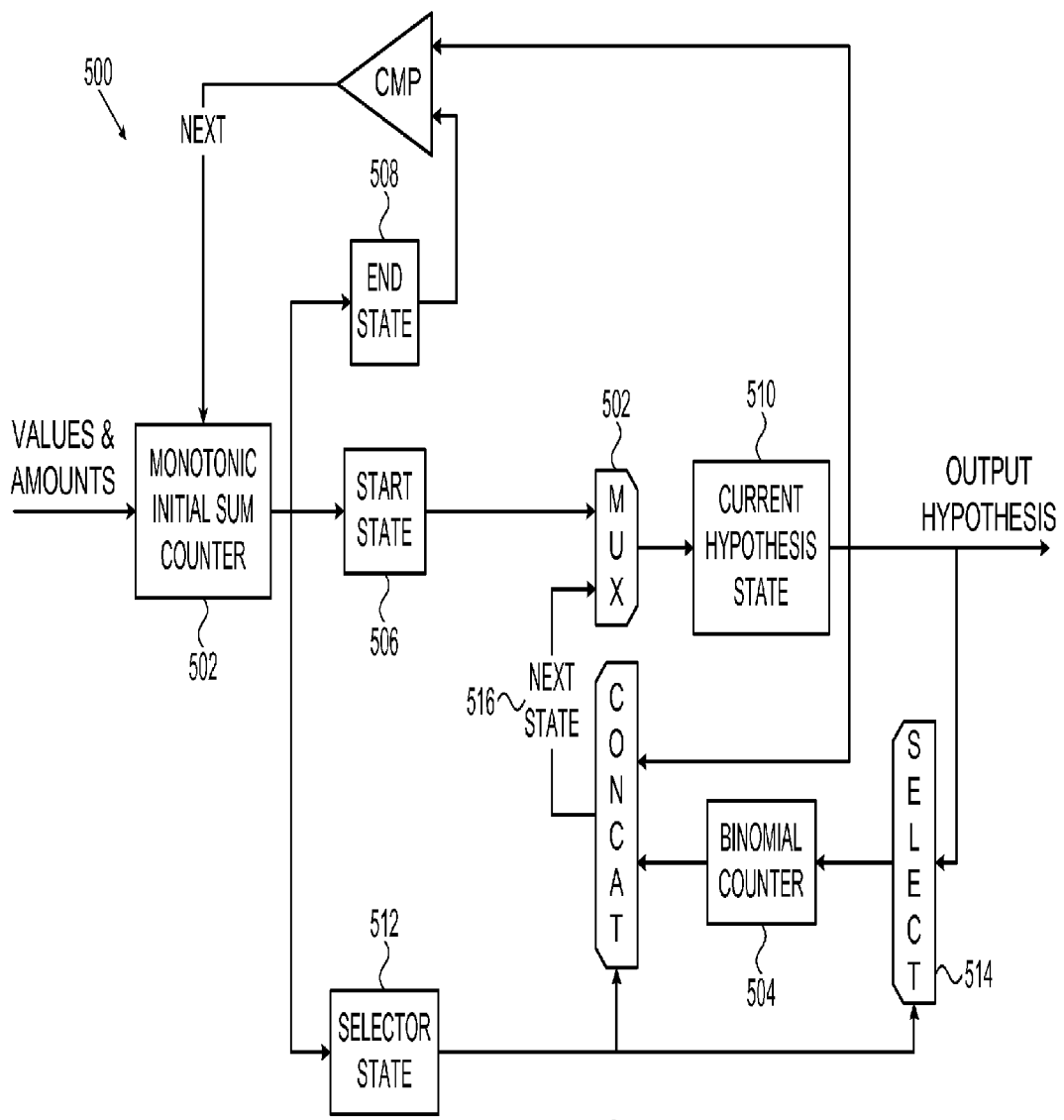
FIG. 5 schematically illustrates a system for on-the-fly enumeration of hypothesis error corrections according to an embodiment of the invention.

Reference is made to FIG. 5, which schematically illustrates a system 500 for on-the-fly enumeration of hypothesis error corrections according to an embodiment of the invention.

System 500 may include a monotonic counter 502, a binomial counter 504, a start state 506, an end state 508, a current hypothesis state 510, a selector state 512, a selector unit 514, and a next state 516. System 500 may receive a set of reliability probability values for a set of bits (e.g., the sum of the |LLR| value for each bit) and may enumerate hypothesis corrections over a plurality of combinations of those bits, on-the-fly, for example, from the lowest to highest reliability probability. System 500 may output a new enumerated hypothesis in each clock cycle. For every hypothesis of a bit flip, the decoder may decode the associated component codes and return an updated reliability metric for the hypothesis. If the reliability metric associated with the set of bits corrected by the hypothesis satisfies a threshold condition or exhausts enumeration after decoding a maximal number of hypotheses, decoding may succeed and the bit flip(s) of the hypothesis may be applied to correct the input bits.

Monotonic counter 502 may provide and increment values for the enumeration. For example, each hypothesis may have a number of one or more candidate bits corrected by the hypothesis and an associated reliability value or metric (e.g., reliability probability, such as a sum-|LLR| value for those bit(s)). Monotonic counter 502 may increment over all possible combinations of hypotheses associated with each specific reliability value, in order of the reliability values. Monotonic counter 502 may initiate hypothesis enumeration with a single candidate bit (correcting a single error) with a lowest associated reliability value (e.g., single candidate bits A, B, or C with a sum of |LLR| values of zero in Table 1). Monotonic counter 502 may then keep the reliability value constant and increment the number of candidate bits having the same reliability value (e.g., pairs of two candidate bits AB, AC, and BC and then groups of three candidate bits ABC with sum-|LLR| values of zero in Table 1). After exhausting all enumeration combinations for the same reliability value, monotonic counter 502 may increment the reliability value to the next lowest reliability value and enumerate over the number of candidate bits having that reliability value. The process may repeat for on-the-fly enumeration of hypothesis sorted in order of a monotonically non-decreasing (e.g., increasing) reliability values (e.g., lowest to highest sum-|LLR| values).

Although monomial counter 502 may order groups of hypotheses having the same reliability values and numbers of candidate bits, binomial counter 504 may order each individual hypothesis within each group to pick an exact hypotheses for each sequential decoding attempt. In one example, binomial counter 504 may enumerate vectors or sequences of values (e.g., zeros and ones) and may increment over all combinations that give the same combination of values (e.g., the same number of zeros and ones). To select a hypothesis from each enumerated group, binomial counter 504 may select the hypothesis having a sequence of reliability values that matches the current enumerated vector sequence. For example, to correct two bits in a sequence of four bits (e.g., ABCD), binomial counter 504 may sequentially increment a vector from 0011=>0101=>0110=>1010=>1100 (e.g., corresponding to flip CD, flip BD, flip BC, flip AC, flip AB).

Start state 506 (e.g., vector state 0011) and end state 508 may be the boundary states of binomial counter 504. Start state 506 may be the initial state of binomial counter 504 defining the first hypothesis to be decoded for each monotonic counter 502 result. End state 508 may be the final state of binomial counter 504 defining the last hypothesis to be decoded for each monotonic counter 502 result. After decoding a hypothesis for end state 508, monotonic counter 502 may increment to the next result, and a new start state 506 may be loaded to restart the enumeration configuration. Current hypothesis state 510 may define the current enumeration state and may increment from start state 506 to end state 508 and all states in between to define a current hypothesis. The output of current hypothesis state 510 may be provided to the decoder to actually flip the bit(s) defined thereby. Selector state 512 may select the set of candidate bits with the same value sequence as the current hypothesis state 510. Binomial counter 504 may select a single hypotheses (e.g., selected by selector state 512) to be decoded in each clock cycle for on-the-fly decoding. A select unit 514 may separate the selected candidate bits from the whole state to output the selected bits to binomial counter 504. The selected state may be concatenated with current hypothesis state 510 to get next state 516. In one embodiment, only a single value for a single hypothesis may be updated in each clock cycle.

An enumeration operational flow of system 500 may proceed, for example, as follows:

(1) Enumerator may receive, as an input, an array of reliability probability values and a number of corrected bits associated with each value for each of a plurality of correction hypotheses for a set of bits. The reliability values may be pre-scaled, for example, as bounded integer values of mapped LLR values, and pre-sorted from the lowest to highest reliability probability values.

(2) Monotonic counter 502 may initiate by setting current hypothesis state 510 to a first state defining the lowest reliability value associated with correcting a single candidate bit.

(3) Start state 506 may be generated and loaded with current hypothesis state 510.

(4) Binomial counter 504 may increment current hypothesis state 510 by a single enumeration, in each clock cycle, until reaching end state 508.

(5) Once end state 508 is reached, monotonic counter 502 may increment to the next counter state.

In each clock cycle, each time binomial counter 504 is set or incremented, binomial counter 504 may output current hypothesis state 510 to a decoder to decode a new hypothesis in each clock cycle, for example, on-the-fly (after the hypothesis is enumerated). The enumeration process may stop if the output current hypothesis state 510 is successfully decoded and, if not, the process may increment the monomial and/or binomial counter(s) to next state 516. The enumeration process may end if one of the following conditions are satisfied: (a) the reliability metric of a decoding solution satisfies a threshold condition, for example, the sum-|LLR| of the hypothesis and associated decoder solution is smaller than a pre-defined threshold, (b) a predefined maximum enumeration is reached, or (c) monotonic counter 502 reaches a maximum increment value enumerating the final hypothesis. The enumeration process typically ends after applying a hypothesis yielding a decoding solution with the highest likelihood.

In some embodiments, the gate count used for enumeration may be minimized. In one embodiment, an a priori number of candidate bits corrected for each reliability value (quantized LLR value) may be unknown and may be set to a maximum number, for example, the length of the sorted elements' buffer. Accordingly, a maximum number of bits may be allocated to each value. Such allocation may use a high gate count, especially if implemented using Flip-Flops (FFs) (each FF is equal to 8 up-to 10 gates). In another embodiment, the total maximum amount of members may be known (e.g., set as a design input) and the number of allocated bits may be set to this maximum value. Such implementations may minimize the gate counts and number of FFs used. However, such implementations may use significantly larger multiplexers to select the input and output of binomial counter 504. However, such implementations may also be much more efficient than the alternative implementation via FFs, for some typical maximal values of elements.

Figure 6:
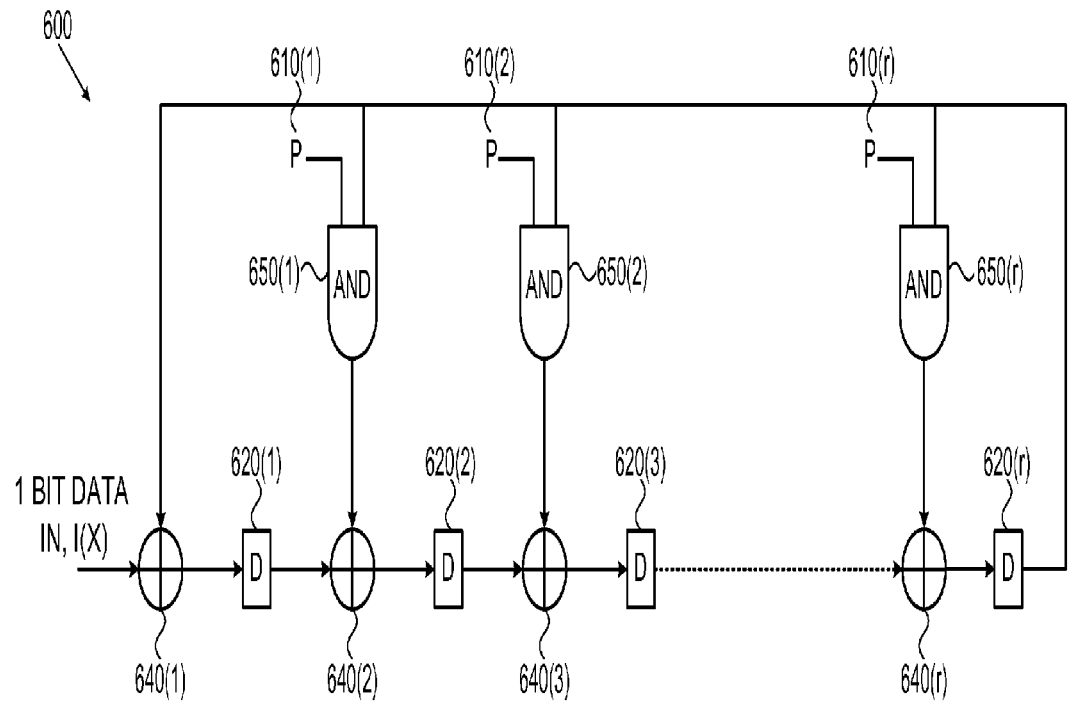
FIG. 6 schematically illustrates a system for executing a cyclic redundancy check (CRC) engine according to an embodiment of the invention. according to an embodiment of the invention.
Figure 6:
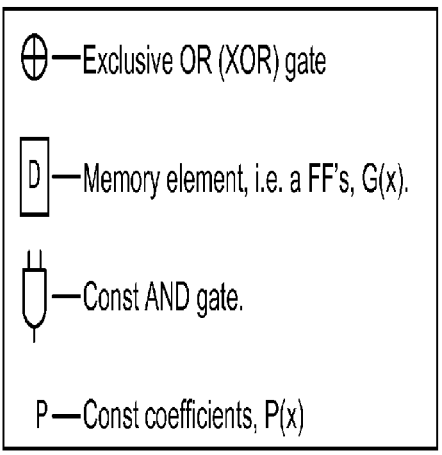

After errors are corrected, a CRC engine may validate or invalidate the corrections, for example, as described in reference to FIG. 6.

Reference is made to FIG. 6, which schematically illustrates a system 600 for executing a CRC engine according to an embodiment of the invention. A CRC engine may receive, as input, a stream of input bits. For each input bit, x, the CRC engine may generate as an output a CRC value, for example, $G(x)=I(x)mod(P(x))$, where $G(x)$ may be the content of CRC memory-elements, $I(x)$ may be an input polynomial and $P(x)$ may be a feedback polynomial (e.g., which may be constant for each particular CRC circuit). The output values of the CRC engine, $G(x)$, may be appended to or concatenated with the output data stream (e.g., as systematic data).

In one embodiment, system 600 may include a linear feedback shift-register to execute the CRC engine. Linear feedback shift-register may include r taps including r memory elements 620 (1)-620 (r), r adders (exclusive OR (XOR) gates) 640 (1)-640 (r), r configurable storage element 610 (1)-610 (r) and r logic gates (constant AND gates) 650 (1)-650 (r). Memory elements 620 (1)-620 (r) may store the CRC values and configuration storage elements 610 (1)-610 (r) may store the feedback polynomial P(x). Logic gates 650 (1)-650 (r) may execute an AND operation providing the feedback polynomial P(x) (e.g., output of storage element 610 (1)-610 (r)) to adders 640 (1)-640 (r), which may in turn XOR the feedback polynomial P(x) with the input polynomial I(x) (e.g., output from the previous memory elements 620 (1)-620 (r−1)), to generate CRC values G(x) (e.g., input into the subsequent memory elements 620 (2)-620 (r)), respectively. For a redundancy of r bits, system 600 may correct r/m errors (or more), where the CRC engine operates over a Galois field, $GF(2^m)$.

Figure 7:
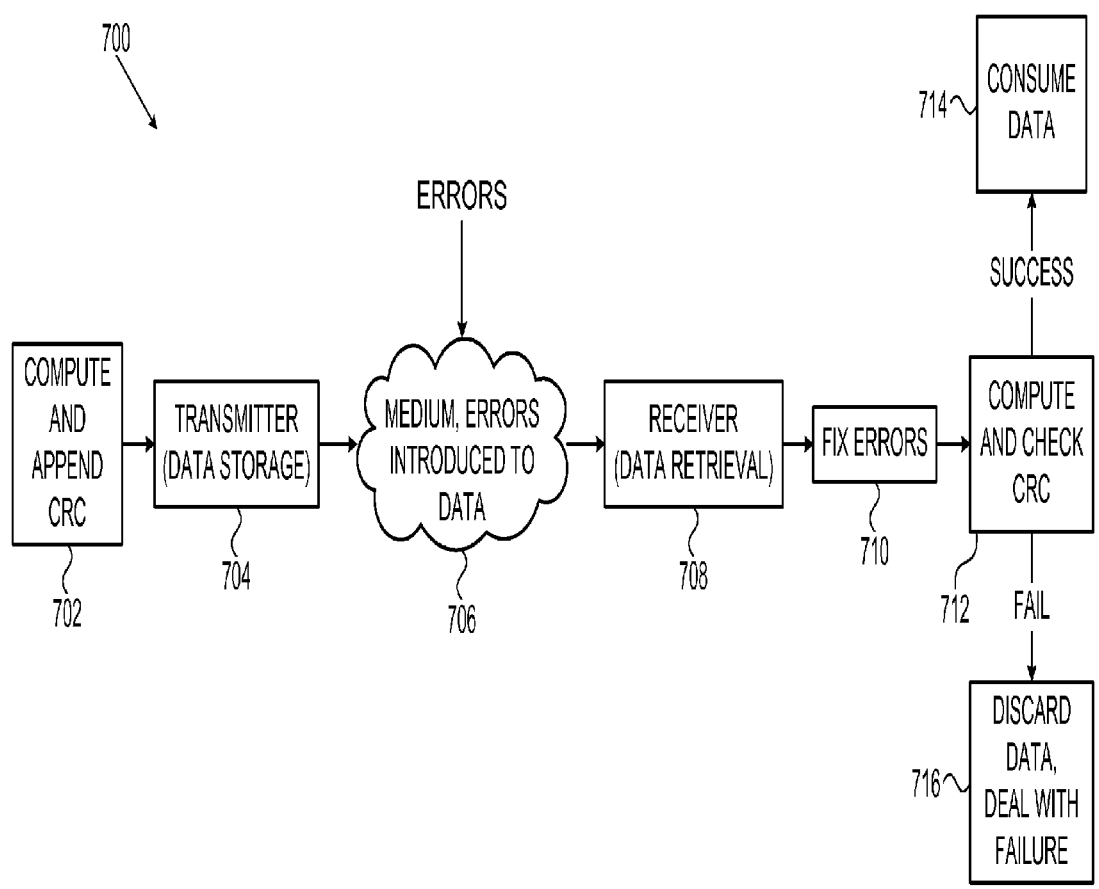
FIGS. 7 and 8 schematically illustrate the flow of data in a system for executing a CRC engine according to an embodiment of the invention.

The CRC data, G(x), output from system 600 may be used to correct errors to the input data, x, for example, as described in reference to FIG. 7.

Reference is made to FIG. 7, which schematically illustrates the flow of data in a system 700 for executing a CRC engine according to an embodiment of the invention.

CRC data 702 may be computed for a set of input data (e.g., as described in reference to FIG. 6). CRC data 702 may be appended or concatenated with the set input data (e.g., to generate systematic data). The concatenated data 704 may be transmitted. "Transmitting" the concatenated data 704 may include any process that may introduce errors 706 into the input data (e.g., storing, transferring, mapping, etc.). A receiver may receive data 708 with potential errors 706. Received data 708 may undergo an error correction process to fix errors 710 therein. After the error correction attempt, CRC data 712 may be recomputed for the entire set of received data 708 with fixed error data 710. The new CRC data 712 may be compared with the original CRC data 702 for the original input data. If the CRC data 702 and 712 match (e.g., having a difference of zero or below a predetermined error threshold), the error correction may be successful and fixed error data 710 may be accepted 714. However, if the CRC data 702 and 710 do not match, the error correction may be unsuccessful and fixed error data 710 may be rejected or discarded 716. For failed error correction, a different (more precise) error correction mechanism may be subsequently used or the data may be requested for re-transmission.

One limitation of system 700 is that the entire set of CRC data is recomputed after an error is corrected, and not in parallel with the error correction, thereby stalling the error correction mechanism. In conventional systems, each correction (of even a single input bit) may cause the CRC data to be recalculate for all input bits, which may use (k) clock cycles for a sequence of (k) input bits, a significant delay.

Embodiments of the invention may exploit the fact that CRC computations are linear and may therefore be computed piecewise and combined. In one example, a first set of CRC data may be computed for the entire set of input data (potentially having errors) in parallel with the error correction for that data, after which a second set of CRC data may be recomputed only for the sub-set of errors corrected by the error correction process. Recomputing CRC values for only the sub-set of (p) corrected bits may use only (p) clock cycles, instead of the (k) cycles used in conventional systems to recompute CRC values for all (k) input bits. The initial CRC values for the entire set of data and the recomputed CRC values for the sub-set of corrected data may be summed to generate recomputed CRC data in significantly less time than conventional systems, for example, as described in reference to FIG. 8.

Figure 8:
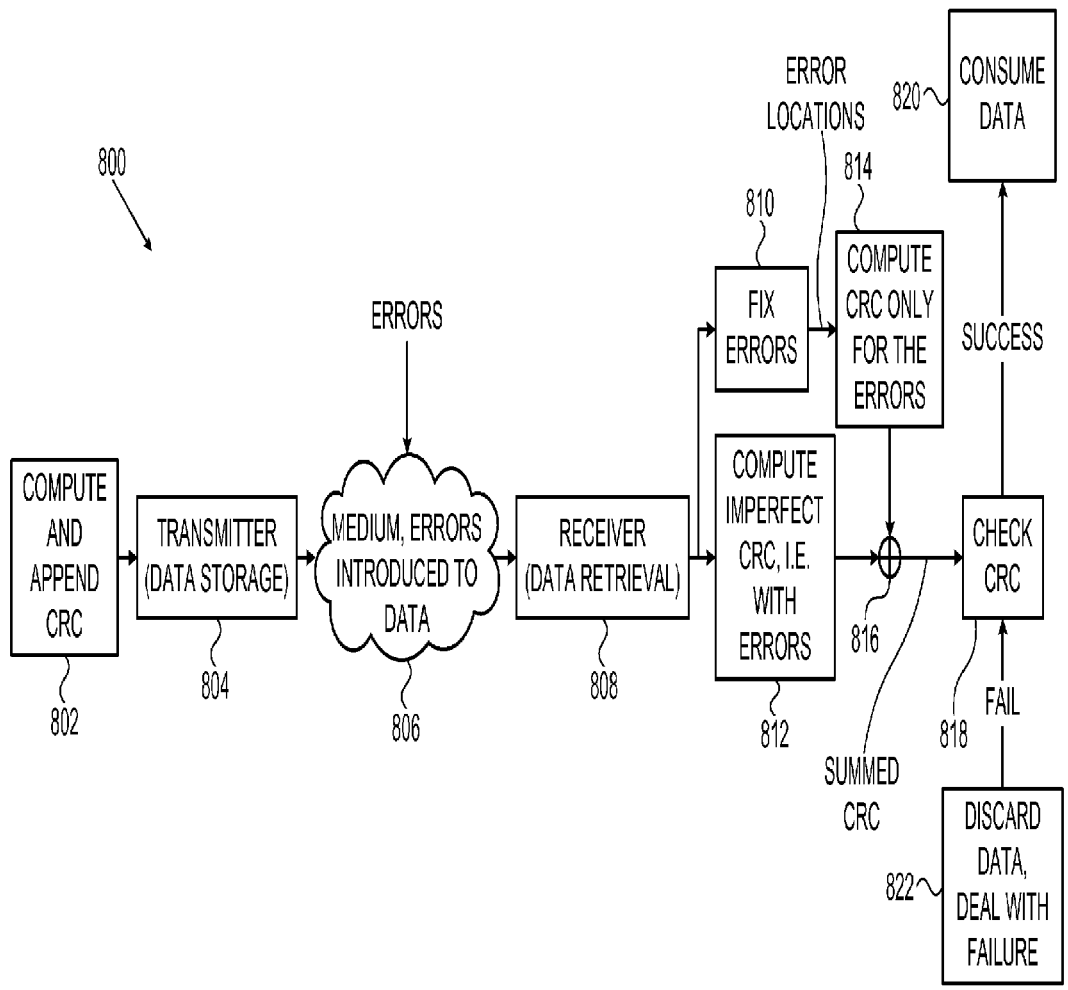

Reference is made to FIG. 8, which schematically illustrates the flow of data in a system 800 for executing a CRC engine according to an embodiment of the invention.

CRC data 802 may be computed for a set of input data. CRC data 802 may be concatenated with the set input data to generate concatenated data 804. Concatenated data 804 may be transmitted, potentially inducing errors 806, and may be received 808, attempting to correct errors 806. Received data 808 may undergo an error correction process to fix errors 810 therein. During the error correction attempt (e.g., in parallel), CRC data 812 may be recomputed for the entire set of received data 808. After the error correction attempt, CRC data 814 may be recomputed for only fixed error data 810 (e.g., the difference between the received and corrected data sets, such as, a sequence of zeros with ones at the data set location(s) where an error is corrected). CRC data 812 (for received data 808) and CRC data 814 (for fixed error data 810) may be summed 816 to generate recomputed data for the entire corrected data set. Recomputing CRC data 814 for only fixed error data 810 may stall the error correction process by a single clock cycle per corrected bit, which is significantly fewer clock cycles than used to recompute CRC values for the entire set of data after the error correction, as in FIG. 7. The original CRC data 802 and summed CRC data 816 may be compared 818 to evaluate the validity of the corrected data. If the original CRC data 802 and the summed CRC data 816 match (e.g., having a zero or threshold difference value), the error correction may be successful and fixed error data 810 may be accepted 820. However, if the CRC data 802 and 816 do not match, the error correction may be unsuccessful and fixed error data 810 may be discarded 822.

Accordingly, embodiments of the invention may recompute CRC values for a flipped bit within the data set using only a delay of a single clock cycle. In one embodiment, CRC data 814 (for only fixed error data 810) may be recomputed by using an error vector including zeros at indices for which the original data is not changed non-zero values at jth indices for which the original data is changed. The error vector may be cycled through a linear feedback shift-register to increment the changed jth indices to achieve CRC values and leave the remaining unchanged indices with zero values. The incremented value may be a primitive element defined by a finite field in which the CRC values are computed.

In some embodiments, piecewise CRC computations may be used when the feedback polynomial P(x) of the CRC computation (e.g., G(x)=I(x) mod(P(x))) is a generator polynomial of a GF($2^q$) finite field, for example, which is typically true and may be engineered true for almost any new system. Since all elements in a finite field (e.g., GF($2^q$)) may be defined by $(\alpha^n)\mod(p(x))$, where a is a primitive element in that field, any polynomial $m(\alpha)$ that has all its coefficients equal to 0 beside a single coefficient at bit J, e.g., equal to 1 as $m(\alpha)=\alpha^J$. $m(\alpha)$, may have an error vector with an error at bit J. Accordingly, CRC data 814 for each corrected (or flipped) bit, J, may be computed, for example, as $(\alpha^J)\mod(p)$. In some embodiments, the error bit J (e.g., $(\alpha^J)\mod(p)$ in GF($2^q$)) may equivalently be computed, for example, as described in reference to FIG. 9, as a binary polynomial, $J = j_{n-1}2^{n-1} + j_{n-2}2^{n-2} + \ldots j_0$, in a binary field (e.g., GF(2)), and/or according to the data flow described in reference to FIG. 10. In other embodiments, error bit J may be computed by any other method including reading values from a look-up-table.

Figure 9:
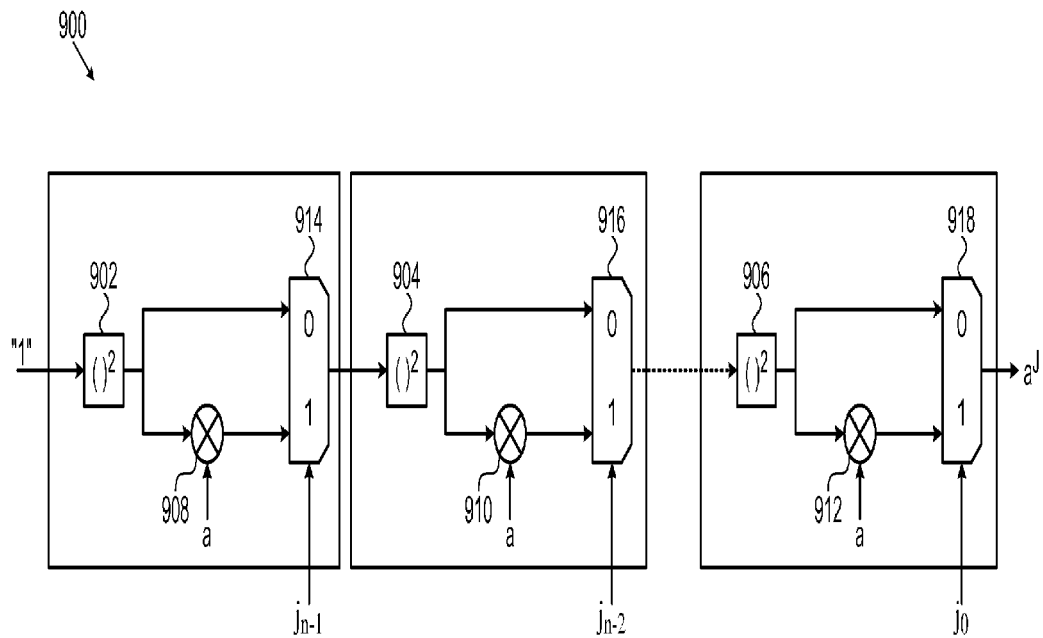
FIG. 9 schematically illustrates a system for computing CRC data for error bits in a binary field according to an embodiment of the invention.
Figure 9:
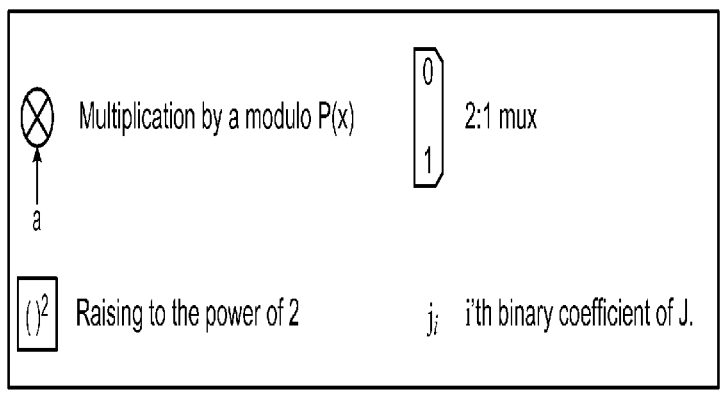

Reference is made to FIG. 9, which schematically illustrates a system 900 for computing CRC data for error bits in a binary field according to an embodiment of the invention.

System 900 may include a linear feedback shift-register, which may receive, as input, an error vector including an error bit J and may generate, as output, the CRC values for the error bit J, for example, as $j_{n-1}2^{n-1} + j_{n-2}2^{n-2} + \ldots j_0$, in binary field, GF(2), where ji is the coefficient of the $i^{th}$ binary power term. The linear feedback shift-register may include a plurality of power cells 902, 904, . . . , 906, to raise an input by a power of 2, multipliers 908, 910, . . . , 912 to multiply each binary power by $(\alpha)\mod(p(x))$, (2:1) multiplexer 914, 916, . . . , 918 to determine whether or not to multiply the output ( )^2 of power cells 902, 904, . . . , 906 by a $((a)\mod(p(x)))$].

It may be noted that, in some embodiments, the number of power cells 902, 904, . . . , 906 in FIG. 9 used to compute the CRC for an error bit J may depend on the power or maximal size of the error bit J and not on the order of the finite field, $2^q$. In cases where the power of error bit J is significantly small, system 900 may use significantly fewer power cells 902, 904, . . . , 906, including fewer multipliers, multiplexers and other hardware, than may be used for relatively larger order error bits.

Figure 10:
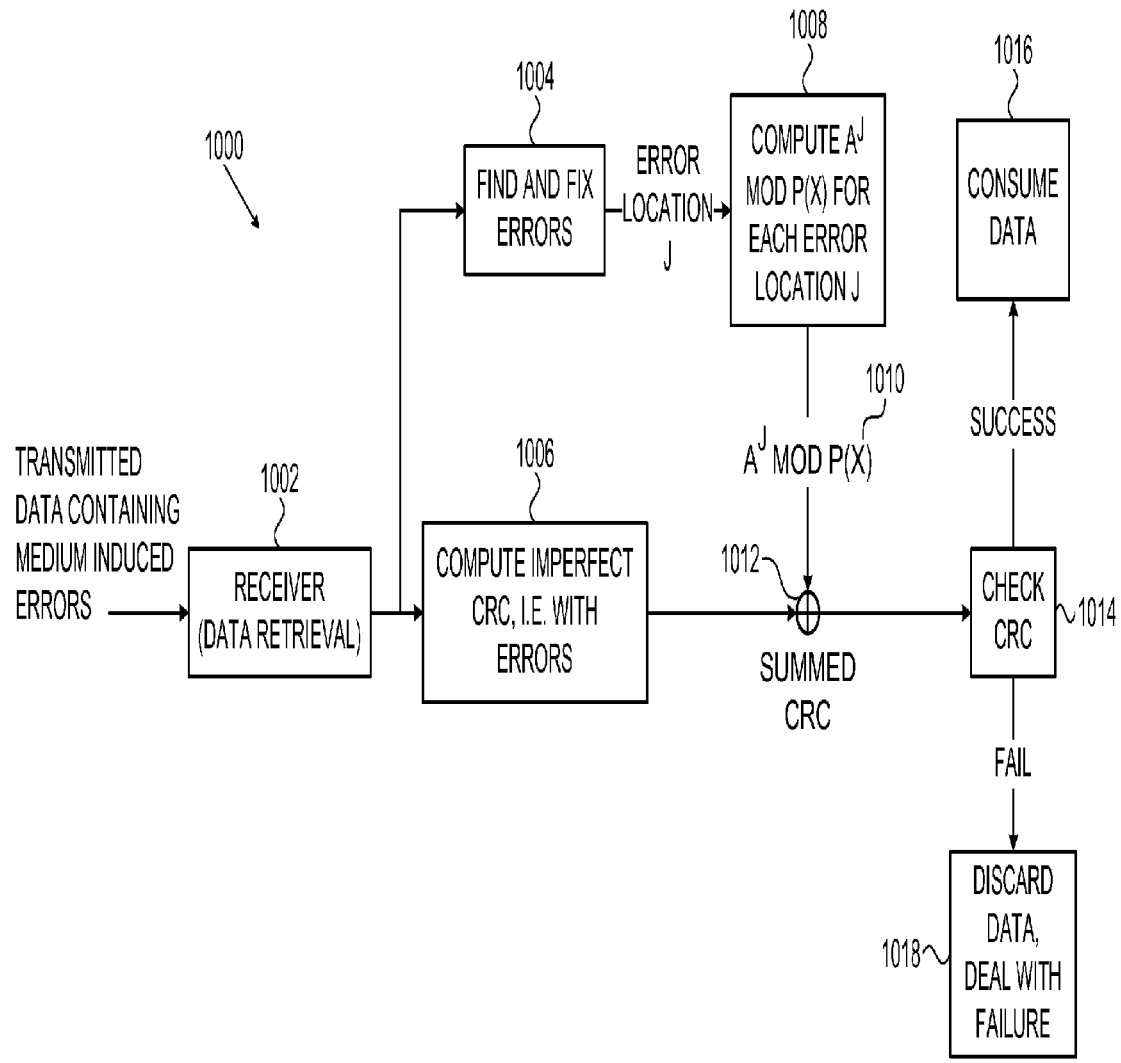
FIG. 10 schematically illustrates the flow of data in a system for executing a CRC engine according to an embodiment of the invention.

The CRC data for each error bit J, for example, generated as described in reference to FIG. 9, may be computed as described in the data flow of FIG. 10.

Reference is made to FIG. 10, which schematically illustrates the flow of data in a system 1000 for executing a CRC engine according to an embodiment of the invention.

A receiver may receive data 1002, which may potentially include errors (e.g., induced by transmitting or otherwise manipulating the data), and original CRC data (e.g., generated before transmitting the data). Received data 1002 may undergo an error correction process to find and fix errors 1004 therein. During the error correction process, imperfect CRC data 1006 may be computed for the entire set of received data 1002. After the error correction process, CRC data 1008 may be recomputed for only fixed error data 1004. Each error bit in fixed error data 1004 may be located, for example, at a jth index. CRC data 1010 for the jth error bit may be computed, for example, as $(\alpha^n) \bmod(p(x))$ (e.g., in $GF(2^q)$). CRC data 1006 (for received data 1002) and CRC data 1010 (for fixed error data 1004) may be summed 1012 to generate recomputed data for the entire corrected data set. Summed CRC data 1012 may be compared to an original set of CRC data (e.g., received with a zero or threshold difference value). The original CRC data and summed CRC data 1012 may be compared 1014 to evaluate the validity of the corrected data. If summed CRC data 1012 sufficiently matches the original CRC data, the fixed error data 1004 may be successful and may be applied 1016 to correct errors in received data 1002. Otherwise, fixed error data 1004 may be discarded 1016.

Since CRC data (e.g., $\alpha^J \bmod p(x)$) for each error may be computed in a single clock cycle and each error may be located in a single clock cycle, embodiments of the invention provide an efficient decoding system, for example, well adapted for iterative and fast decoding.

Another aspect of a multi-dimensional decoder is a highly configurable architecture for correcting errors. Typically, each component code and associated error correction hardware is configured (e.g., using software) to correct data for up to a specific maximum number of errors. Correcting each component code may include calculating error syndromes of the code, deriving an associated ELP using the error syndromes where the roots of the ELP define the locations of errors in the component code, solving the ELP to locate the errors, and correcting the error at the calculated error locations. Different encoder/decoder hardware is conventionally used to encode/decode component codes of each different configuration, thereby using a large gate count and amount of error correction hardware to accommodate multiple different component code configurations.

According to embodiments of the invention, the same error correction hardware may be used to solve component codes with multiple different configurations. For example, a multi-dimensional encoder/decoder with the same configuration may solve (e.g., BCH) code components configured to correct data for up to $t=3$ errors and up to $t=2$ errors. Different code configurations may be useful for different purposes. For example, in a multi-dimensional code, component codes with correction capability of up to $t=2$ errors may be used in one dimension and component codes with correction capability of up to $t=3$ errors may be used in another dimension.

In one embodiment, to adapt the same hardware to solve component code and ELPs with fewer roots (correcting fewer errors), an extra "virtual root" may be added to convert the ELP (e.g., from a quadratic polynomial to solve up to 2 errors) to a higher degree (e.g., a cubic polynomial to solve up to 3 errors). The converted higher power ELP may be solved by a component code configured to correct errors of up to the same higher order power. The component code may generate actual roots as well as virtual root(s). The virtual root may be identified (e.g., at a known location) and deleted or ignored. The virtual root locations may be predetermined within the component code or may define an extended location (e.g., in an extended component code bits appended to the original component code) or a "virtual" location (e.g., which does not exist in the component code). One or more of the actual roots (up to the maximum error count number configured for the component code) may be defined as the locations of errors in the component code and may be corrected.

Figure 11:
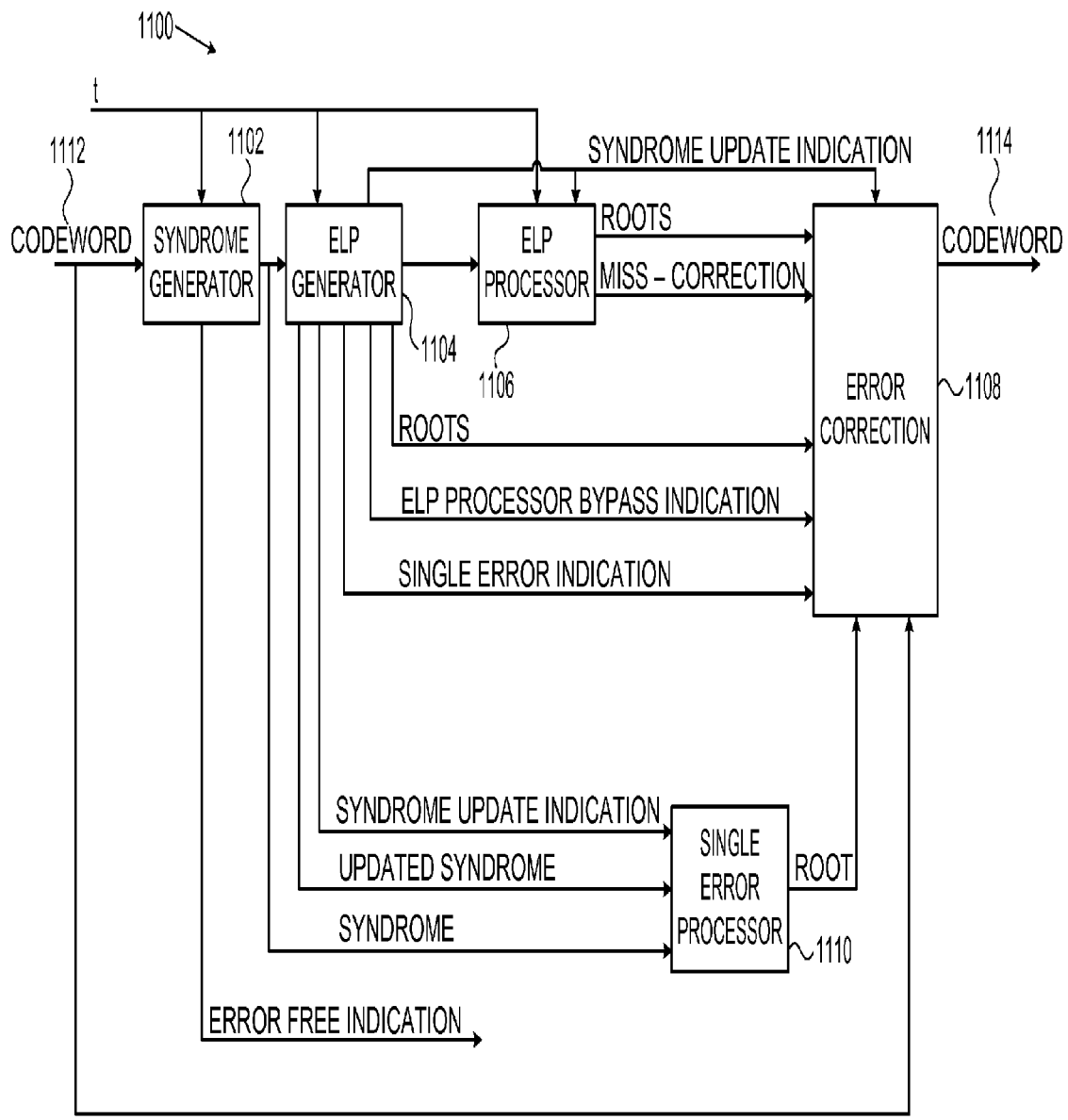
FIG. 11 schematically illustrates a system for decoding according to an embodiment of the invention.

Reference is made to FIG. 11, which schematically illustrates a system 1100 for decoding according to an embodiment of the invention.

System 1100 may include a syndrome generator 1102, an ELP generator 1104, an ELP processor 1106, an error correction unit 1108, a single error processor 1110 and an input stream 1112. Syndrome generator 1102 may compute syndromes defining errors in each component codeword in input stream 1112. If all syndromes computed for a component codeword are zero, the codeword may pass unaltered through system 1100 as an error-free (or valid) codeword. Otherwise the set of syndromes may be delivered to ELP generator 1104. ELP generator 1104 may use the syndrome calculations to generate an ELP defining the locations of errors in each of the component codes. If the ELP has a power (e.g., 2) less than the maximum configured error count (e.g., 3), ELP generator 1104 may multiply the ELP by a number of virtual roots defining the difference therebetween to convert the polynomial to have a power equal to maximum error count configuration. Otherwise, if the ELP has a power equal to the maximum error count configuration, the ELP may remain unaltered. ELP processor 1106 may solve the ELP, for example, by a numerical approximation method or using values predefined in a look-up table, to determine the error locations in the component code. ELP processor 1106 may be an integrated circuit, such as, and ASIC, specifically designated to solve ELPs, or alternatively may be a main processor (e.g., processor 104 of FIG. 1) running an ELP solving task. Error correction unit 1108 may apply corrections to erroneous input data at the computed locations to correct component codes in an output stream 1114. In some embodiments, a separate single error processor 1110 may solve single error component codes separately (e.g., without using ELPs) by flipping each sequential single bit until an error correction is detected. Alternatively, single error component codes may be solved using ELP processor 1106 and a separate single error processor 1110 need not be used.

Embodiments of the invention may reuse encoder/decoder hardware, which is configured to solve ELPs of a specific degree (and therefore locate errors in the component codes of up to a specific maximum number of errors), to also solve ELPs of a different relatively lower degree (and therefore locate errors in other component codes differently configured to solve up to a different maximum number of errors). For example, ELP generator 1104 may multiply the relatively lower degree ELP by a factor defining a virtual or default root to achieve the ELP of the specific degree solvable by the reused component code decoder. In one example, when component codes are configured to solve up to three-bit errors, ELP generator 1104 may convert quadratic ELPs (for solving up to two-bit errors) to a cubic ELP (for solving up to three-bit errors). Since component codes configured to solve up to two-bit errors (as well as up to three-bit errors) are solvable by the same hardware configured to solve up to three-bit errors, system 1100 need not store hardware designed to correct component codes configured for solving up to two-bit errors, thereby significantly reducing system overhead designated to store and manage the two-bit maximum error hardware.

In one example, input stream 1112 may include a three-bit maximum error component code. Syndrome generator 1102 may compute syndrome values, $S_1, S_2, S_3, S_4, S_5, S_6$ for the component code. ELP generator 1104 may generate coefficients, $\Lambda_0, \Lambda_1, \Lambda_2, \Lambda_3$, for an ELP using the input syndrome values, for example, as:

$$\Lambda_3 = S_1^3 + S_3 + S_1 \cdot \Lambda_2$$

$$\Lambda_2 = (S_1^2 \cdot S_3 + S_5)/(S_1^3 + S_3)$$

$$\Lambda_1 = S_1$$

$$\Lambda_0 = 1 \tag{1}$$

ELP generator 1104 may use the coefficients, $\Lambda_0, \Lambda_1, \Lambda_2, \Lambda_3$, to generate a cubic ELP, for example, as:

$$\Lambda(x) = \Lambda_3 \cdot x^3 + \Lambda_2 \cdot x^2 + \Lambda_1 \cdot x^1 + \Lambda_0 = 0 \quad (2)$$

The cubic ELP may be expressed in an equivalent simplified form, for example, as:

$$y^3 + y + k = 0 \quad (3)$$

where, $$x = \frac{\Lambda_2 + y \cdot (\Lambda_2 + \sqrt{\Lambda_1 \cdot \Lambda_3})}{\Lambda_3} \quad (4)$$

ELP processor 1106 may derive two of the three roots of the cubic equation (3), for example, by reading the corresponding entries from a look up table (LUT) of size $2 \times 2^m$ and the third root, for example, to be defined parametrically as:

$$y_2 = y_0 + y_1 \quad (5)$$

ELP processor 1106 may output the roots of the ELP to error correction unit 1108, which may solve the component code at those roots.

In another example, input stream 1112 may include a two-bit maximum error component code. Syndrome generator 1102 may compute syndrome values, $S_1, S_2, S_3, S_4$, for the component code. ELP generator 1104 may generate coefficients, $\Lambda_0, \Lambda_1, \Lambda_2$, for an ELP using the input syndrome values, for example, as:

$$\Lambda_2 = (S_1^3 + S_3)/S_1$$

$$\Lambda_1 = S_1$$

$$\Lambda_0 = 1 \quad (6)$$

ELP generator 1104 may use the coefficients, $\Lambda_0, \Lambda_1, \Lambda_2$ to generate a quadratic ELP, for example, as:

$$\Lambda(x) = \Lambda_2 \cdot x^2 + \Lambda_1 \cdot x^1 + \Lambda_0 = 0 \quad (7)$$

ELP generator 1104 may convert the quadratic ELP of equation (7) to have the form of the cubic ELP of equation (2), for example, by multiplying the quadratic ELP by a factor of (x+1), which may be equivalent to inserting a virtual error at a component code index or location of 0 for a third (virtual) root. ELP processor 1106 may solve the converted ELP as defined for a three-bit error maximum component code (e.g., computed according to equations (3)-(5)) to generate three roots including the two real roots (of the original quadratic ELP) and the third added root. ELP processor 1106 may only output the two real roots for error correction unit 1108 to correct and may ignore or discard the third added root.

Accordingly, ELP generator 1104 may deliver ELP coefficients for a cubic ELP regardless of whether the input component codes are adapted for correcting either up to 2 or up to 3 errors. In some embodiments, ELP generator 1104 may deliver information about a scenario type (e.g., the number of real roots/virtual roots) and, in some cases, the roots of the ELP to replace ELP processing.

Figure 12:
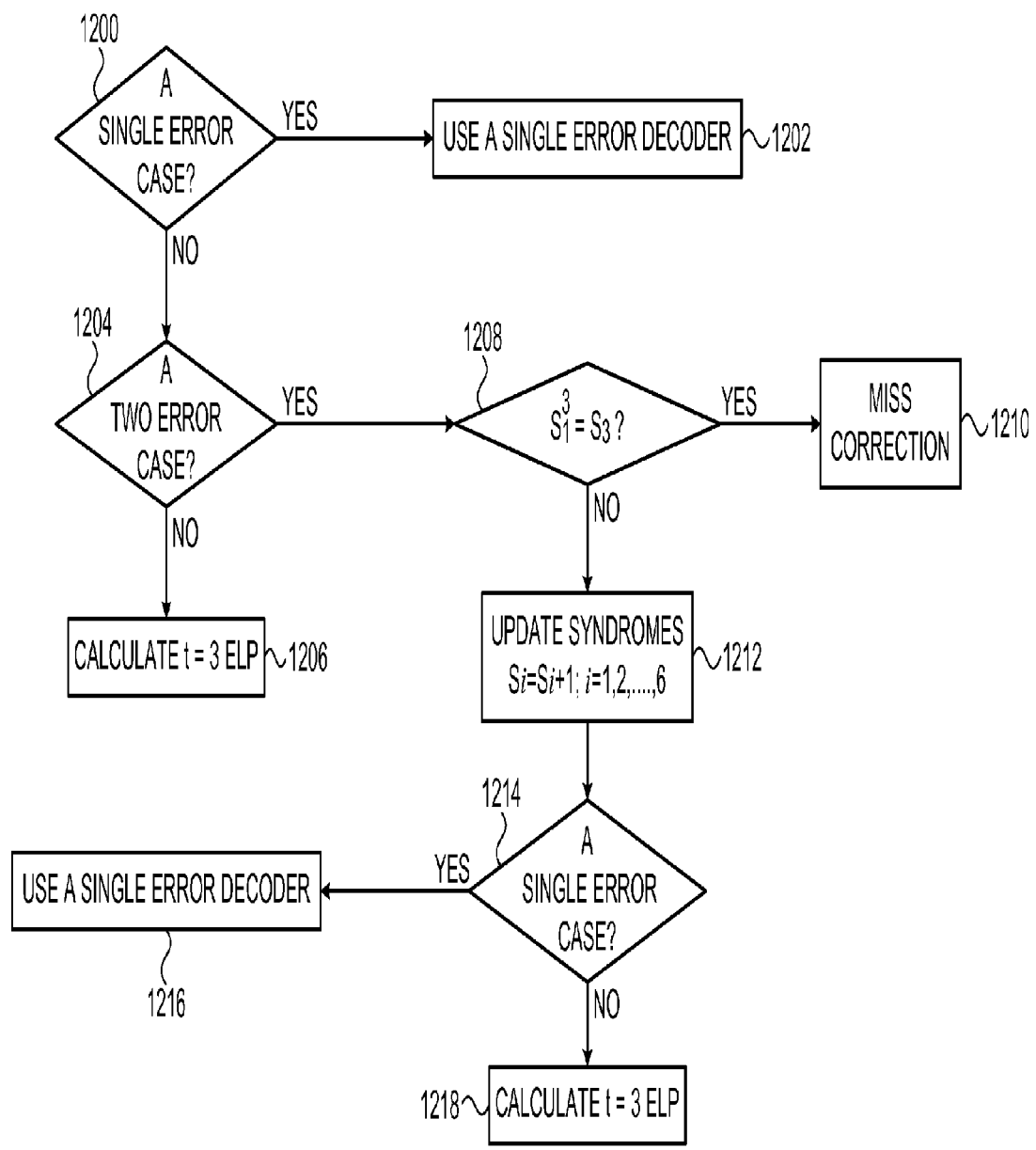
FIG. 12 is a flowchart of a method for decoding data according to an embodiment of the invention.

Reference is made to FIG. 12, which is a flowchart of a method for decoding data according to an embodiment of the invention. In one example, the data may include component codeword for correcting up to three-bit errors per codeword (t=3).

In operation 1200, a system (e.g., system 1100 of FIG. 11) may receive input data (e.g., input stream 1112 of FIG. 11), for example, including a component codeword. The system may detect if the input data has a single error count. In one example, a single error may be detected for a three-bit maximum errors component codeword if, for example, the following relationship is true:

$$(S_1^3 = S_3) \& (S_1^5 = S_5) \quad (8)$$

If the input data has a single error count, the system may transfer the data to a single error processor (e.g., single error processor 1110 of FIG. 11) and a process or processor may proceed to operation 1202 to solve the single error data (e.g., by flipping each sequential single bit until an error correction is detected). Otherwise a process or decoder may proceed to operation 1204.

In operation 1204, the system may detect if the input data has two errors. If the system does not detect two errors in the input data, then the data may have three errors and the component codeword in the input data may be used to correct the three bit errors in operation 1206. If, however, the system does detect two errors in the input data, a process or processor may proceed to operation 1208 to determine if only the left hand term of equation (8) holds, for example, defined as:

$$S_1^3 = S_3 \quad (9)$$

If so, equation (2) may reduce, for example, to:

$$\Lambda(x) = S_1 \cdot (S_1^2 \cdot S_3 \pm S_5) \cdot x^3 + (S_1^2 \cdot S_3 + S_5) \cdot x^2 = 0$$

which does not have three different roots. Accordingly, the system may determine that at least one of the roots is false and a miss-correction may be declared in operation 1210.

If a single root is invalid and two errors remain, a coefficient of the ELP may be set to zero, for example, defined as:

$$\Lambda_3 = 0 \quad (10)$$

and a virtual error may be added.

In operation 1212, a syndrome generator (e.g., syndrome generator 1102 of FIG. 11) may update the syndrome values for the input data. The update may include adding 1 to each of the syndromes, which may for example, be equivalent to inserting an error at a position 0 in the input data.

In operation 1214, the system may re-check if a single error remains in the input data, for example, to determine if one of the two errors is located at the same position as the virtual error (e.g., position 0 in the input data). If a single error is detected in the data, the system may transfer the data to the single error processor and proceed to operation 1216 to solve the single error data. Otherwise, if a single error is not detected in the data, the data may have two real errors and one virtual error and a process or decoder may proceed to operation 1218 to solve the three errors using the three-bit maximum error component codeword.

Other operations, orders of operations or equations may be used.

Figure 13:
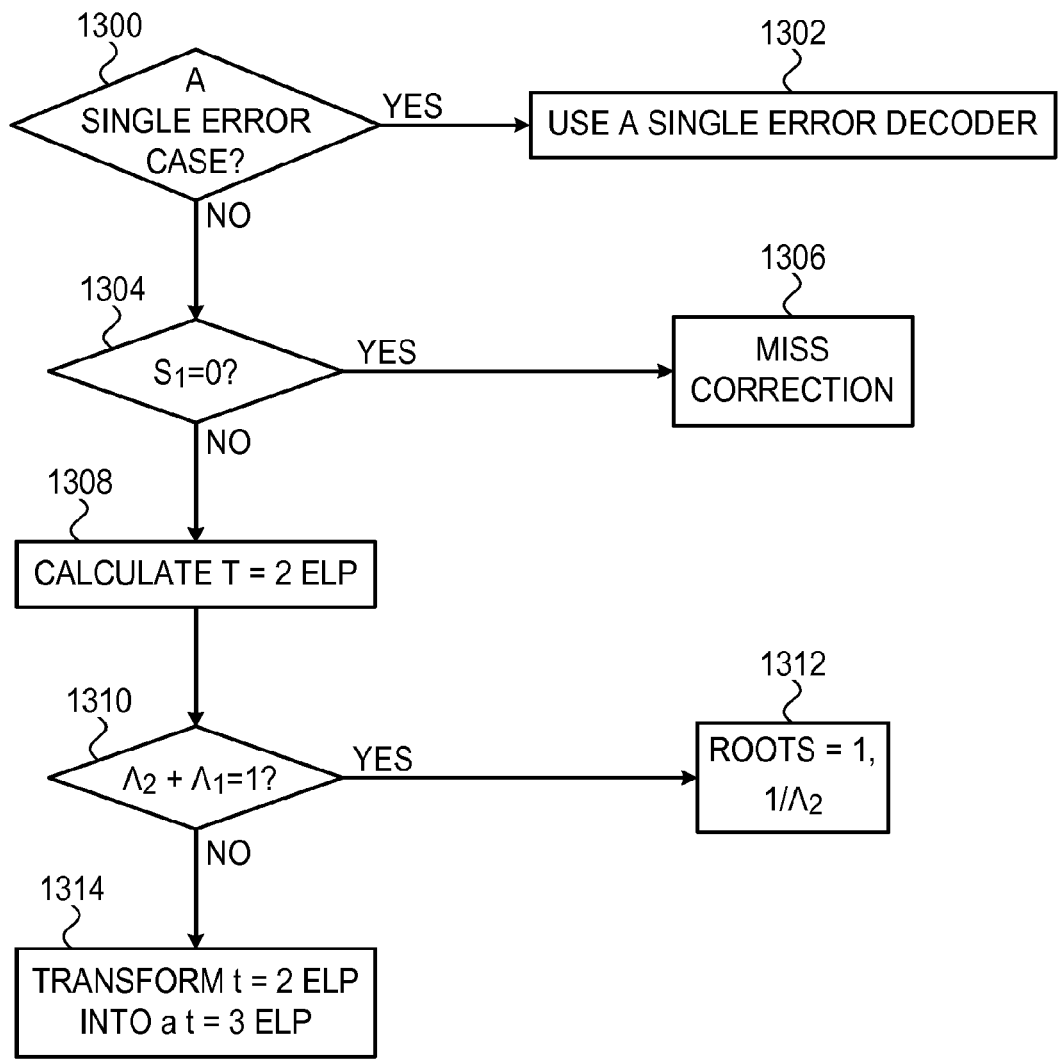
FIG. 13 is a flowchart of a method for decoding according to an embodiment of the invention.

Reference is made to FIG. 13, which is a flowchart of a method for decoding according to an embodiment of the invention. In one example, the data may include component codewords for correcting up to two-bit errors per codeword (t=2).

In operation 1300, a system (e.g., system 1100 of FIG. 11) may receive input data (e.g., input stream 1112 of FIG. 11), for example, including a component codeword. The system may detect if the input data has a single error count. In one example, a single error may be detected for a two-bit maximum errors component codeword if, for example, the following relationship is true:

$$S_1^3 = S_3 \quad (11)$$

If the input data has a single error count, the system may transfer the data to a single error processor (e.g., single error processor 1110 of FIG. 11) and a process or processor may proceed to operation 1302 to solve the single error. Otherwise a process or decoder may proceed to operation 1304.

In operation 1304, an ELP generator (e.g., ELP generator 1104 of FIG. 11) may determine if, for example, the following is true:

$$S_1^3 = S_3 \quad (12)$$

If equation (12) is true, equation (7) may reduce, for example, to:

$$\Lambda(x) \cdot S_1 = S_3 \cdot x^2 = 0 \quad (13)$$

which only has a single solution, x=0. Accordingly, the ELP generator may declare a miss-correction in operation 1306.

However, if equation (12) is false, a process or processor may proceed to operation 1308 to solve for two errors.

When an error occurs at position 0 of the input data, the quadratic ELP of equation (7) may be divisible by a factor of x+1 (e.g., since $\alpha^0=1$). A first factor of x+1 corresponds to a second factor of $\Lambda_2 x+1$. The second factor of $\Lambda_2 x+1$ corresponds to a second root of, for example, $$x = \frac{1}{\Lambda_2}.$$

The ELP generator may detect the presence of these two roots, for example, by substituting x=1 into equation (7) to generate, for example, $\Lambda_2+\Lambda_1=1$.

In operation 1310, the ELP generator may determine if these two roots $$\left(\text{e.g., 1 and } \frac{1}{\Lambda_2}\right)$$

are valid, for example, by substituting x=1 into equation (7) and testing whether or not, for example, the following relationship is true:

$$\Lambda_2+\Lambda_1=1 \quad (14)$$

If equation (12) is true, a process or decoder may proceed to operation 1312 where the roots may be determined to be valid. Otherwise, a process or decoder may proceed to operation 1314.

In operation 1314, the ELP generator may transform the quadratic ELP of equation (7) (e.g., by multiplying the quadratic ELP by a factor of (x+1), which may be equivalent to inserting a virtual error at position 0, since $\alpha^0=1$), to generate a cubic ELP, for example, defined as:

$$\Lambda(x)=\Lambda_2 \cdot x^3+(\Lambda_2+\Lambda_1) \cdot x^2+(\Lambda_1+\Lambda_0) \cdot x^1+\Lambda_0=0 \quad (15)$$

The ELP generator may send the cubic ELP to an ELP processor (e.g., ELP processor 1106 of FIG. 11) to be solved.

Other operations, orders of operations or equations may be used.

Figure 14:
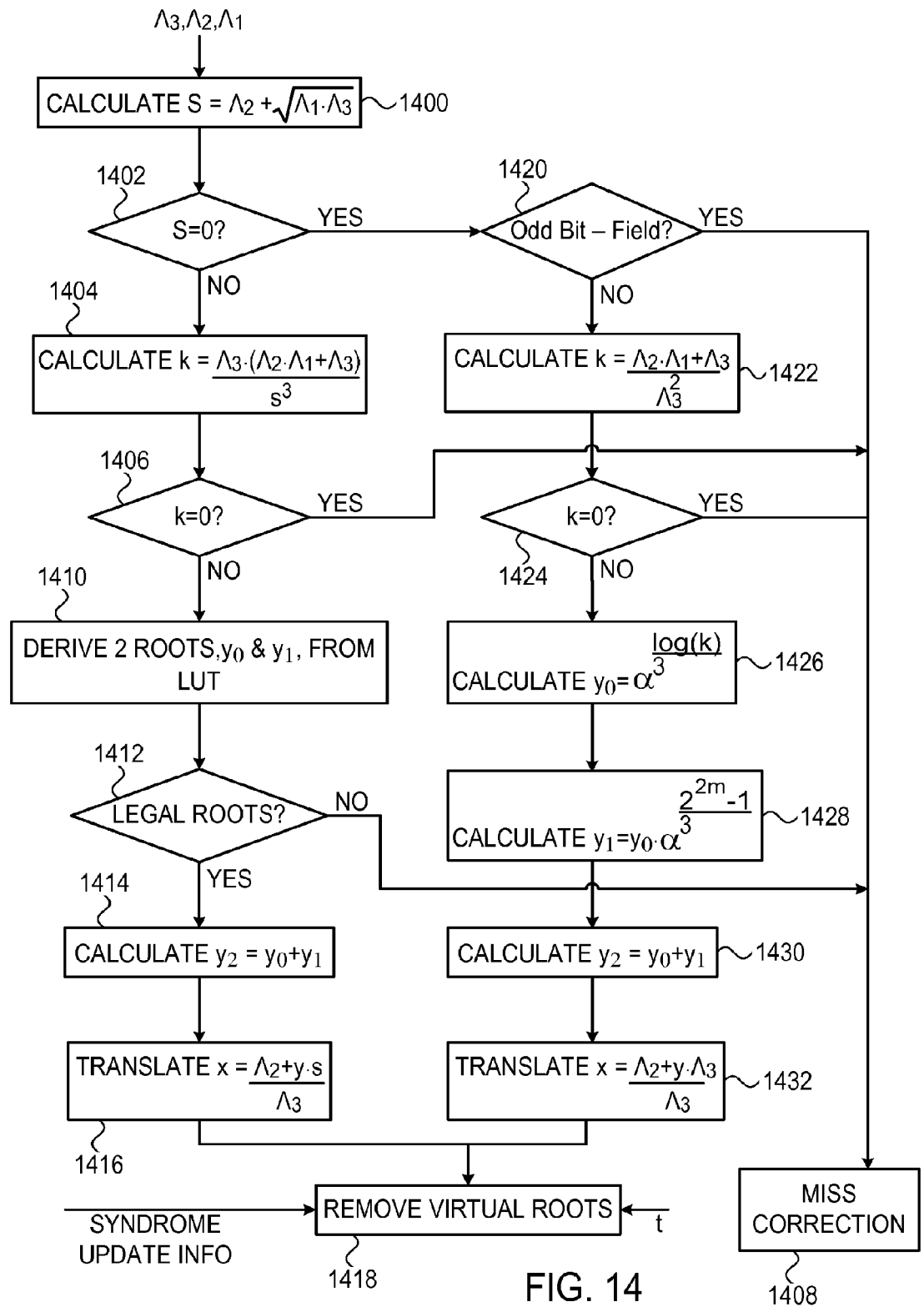
FIG. 14 is a flowchart of a method for solving an error locator polynomial (ELP) according to an embodiment of the invention.

Reference is made to FIG. 14, which is a flowchart of a method for solving an ELP according to an embodiment of the invention. In some examples, a substantially similar process or processor may be used for solving ELPs generated for component codewords configured to correct up to two-bit errors (t=2) or up to three-bit errors (t=3).

In operation 1400, an ELP processor (e.g., ELP processor 1106 of FIG. 11) may receive coefficients $\Lambda_1, \Lambda_2, \Lambda_3$ from an ELP generator (e.g., ELP generator 1104 of FIG. 11) and may calculate, $s=\Lambda_2+\sqrt{\Lambda_1 \cdot \Lambda_3}$.

In operation 1402, the ELP processor may determine if s is equal to zero. If not, the processor may proceed to execute operations 1404-1418. If so, the processor may proceed to execute operations 1420-1432.

The ELP processor may define the following variables:

$$a = \frac{\Lambda_2}{\Lambda_3} \quad (16)$$

$$b = \frac{\Lambda_1}{\Lambda_3}$$

$$c = \frac{\Lambda_0}{\Lambda_3} = \frac{1}{\Lambda_3}$$

The ELP processor may transform the roots of an original cubic ELP of equation (2) to the simplified cubic polynomial, $y^3+y+k=0$, of equation (3) using a translation of, for example:

$$x = a + y \cdot \sqrt{a^2 + b} = \quad (17)$$

$$\frac{\Lambda_2}{\Lambda_3} + y \cdot \frac{\sqrt{\Lambda_2^2 + \Lambda_1 \cdot \Lambda_3}}{\Lambda_3} = \frac{\Lambda_2 + y \cdot (\Lambda_2 + \sqrt{\Lambda_1 \cdot \Lambda_3})}{\Lambda_3}$$

and may compute k, for example, as:

$$k = \frac{(a \cdot b + c)}{\left(\sqrt{a^2+b}\right)^3} = \frac{\Lambda_3 \cdot (\Lambda_2 \cdot \Lambda_1 + \Lambda_3)}{\left(\Lambda_2 + \sqrt{\Lambda_1 \cdot \Lambda_3}\right)^3} \quad (18)$$

In operation 1406, if k=0, the ELP processor may declare a miss-correction in operation 1408 since the single solution for ELPs defined by equation (3) is 0. If, k≠0, the ELP processor may determine if the ELP has a unique solution, for example, if (and only if), for example:

$$Tr_2\left(\frac{1}{k}\right) \neq Tr_2(1) \quad (19)$$

where $Tr_2$ is a the trace operator. Since the cubic ELP of $y^3+y+k=0$ has 3 different roots, if the ELP has a unique solution, the ELP may define more than 3 errors in the input data, which is inconsistent with the input data. Accordingly, the ELP processor may declare a miss-correction in operation 1408. If a unique solution is unavailable, either there are no solutions or 3 solutions to the ELP.

In operation 1410, the ELP processor may derive two roots of the ELP, $y_0$ and $y_1$, for example, from a look-up-table or using a function to solve the ELP in real-time, for example, such as a numerical approximation method. In one example, the look-up-table may store the roots of the cubic ELP for every $k \in GF(2^m)$.

In operation 1412, the ELP processor may determine if the two roots, $y_0$ and $y_1$, are valid. If not, there may be no real roots of the ELP and the ELP processor may declare a miss-correction in operation 1408. If the two roots are valid, the ELP processor may proceed to operation 1414 to calculate the remaining (third) root.

In operation 1414, the ELP processor may calculate the third root, $y_2$, of the ELP, for example, as:

$$y_2 = y_0 + y_1 \quad (19)$$

In operation 1416, the ELP processor may use the transformation of equation (17) to transform the solution of the simplified cubic polynomial, $y^3+y+k=0$, of equation (3) to the original cubic ELP, $\Lambda(x)=\Lambda_3 \cdot x^3+\Lambda_2 \cdot x^2+\Lambda_1 \cdot x^1+\Lambda_0=0$, of equation (2).

In operation 1418, the ELP processor may discard or ignore virtual roots if the cubic ELP is converted from a quadratic ELP, for example, generated for component codes with up to two-bit error correction capability (t=2) or degenerated from an original ELP for component codes with up to three-bit error correction capability (t=3).

In some cases, the transformation of equation (17) may not be valid, since, $s=\Lambda_2+\sqrt{\Lambda_1 \cdot \Lambda_3}$ is equal to zero:

$$\Lambda_2+\sqrt{\Lambda_1 \cdot \Lambda_3}=0 \tag{20}$$

In such cases, the cubic polynomial, $y^3+y+k=0$, of equation (3) degenerates into $$y^3+k=0 \tag{21}$$

where $$k = \frac{\Lambda_2 \cdot \Lambda_1 + \Lambda_3}{\Lambda_3^2} \tag{22}$$

defining a different transformation, for example:

$$x = a+y = \frac{\Lambda_2}{\Lambda_3}+y = \frac{\Lambda_2+y \cdot \Lambda_3}{\Lambda_3} \tag{23}$$

from the ELP, $y^3+y+k=0$, of equation (3) to the original ELP, $\Lambda(x)=\Lambda_3 \cdot x^3+\Lambda_2 \cdot x^2+\Lambda_1 \cdot x^1+\Lambda_0=0$, of equation (2).

In operation 1420, the ELP processor may determine if the numerical field being used is an odd bit-field, e.g., $GF(2^{2m+1})$, or an even bit-field, e.g., $GF(2^{2m})$. For an odd bit-field, $GF(2^{2m+1})$, there may be only a single solution to the cubic ELP defined by equation (21), thus the ELP processor may declare a miss-correction in operation 1408. For an even bit-field, $GF(2^{2m})$, there may be either no solution or three solutions to the cubic ELP defined by equation (21).

In operation 1422, the ELP processor may derive k (e.g., using a look-up-table) to be as the power of the primitive element of the field, for example:

$$k = \frac{(\Lambda_2 \cdot \Lambda_1 + \Lambda_3)}{\Lambda_3^2} \tag{24}$$

In operation 1424, if k=0, the ELP processor may declare a miss-correction in operation 1408 since the single solution for ELPs defined by equation (21) is 0. If, k≠0, the ELP processor may determine if the ELP has three solutions or no solutions. If the logarithm of k, log(k), is not a multiple of three, there may not be three roots in the ELP and the ELP processor may declare a miss-correction in operation 1408. Otherwise the ELP may have three solutions and a processor may proceed to operations 1426-1430.

In operation 1426, the ELP processor may compute the first root, for example, as:

$$y_0 = \alpha^{\frac{\log(k)}{3}} \tag{24}$$

Since $y_0$ is a solution of the ELP defined by equation (21), so is $y_1$, since $y_1^3=y_0^3 \cdot \alpha^{2^{2m}-1}=y_0^3=k$, and for any $m$ $2^{2m}-1$ is a multiple of 3.

In operation 1428, the ELP processor may compute a second root derived from the first root, for example, by the relationship:

$$y_1 = y_0 \cdot \alpha^{\frac{2^{2 \cdot m}-1}{3}} \tag{25}$$

In operation 1430, the ELP processor may compute a third root derived from the first and second roots, for example, by the relationship:

$$y_2=y_0+y_1 \tag{26}$$

In operation 1432, the ELP may use the transformation of equation (23) to transform the solution of the simplified cubic polynomial, $y^3+k=0$, equation (21) to the original cubic ELP, $\Lambda(x)=\Lambda_3 \cdot x^3+\Lambda_2 \cdot x^2+\Lambda_1 \cdot x^1+\Lambda_0=0$, of equation (2).

In operation 1418, the ELP processor may discard or ignore virtual roots if the cubic ELP is converted from a quadratic ELP, for example, generated for component codes with up to two-bit error correction capability (t=2) or degenerated from an original ELP for component codes with up to three-bit error correction capability (t=3).

Other operations, orders of operations or equations may be used.

It may be appreciated that different dimensions of multi-dimensional data may refer to different encoded versions of the same or overlapping data. These different versions may use different component codes, different orders or groupings of data bits. Each sequential dimension of encoded data may correspond to encoding data in a sequentially higher dimension of a multi-dimensional source data array or a 3D shape such as geometric prisms, such as, a cube. For example, each bit of encoded information (e.g., each parity bit) in a first dimension of encoded data may be generated by encoding a single dimension of the source data (e.g., a single row in a data array), while each bit of encoded information in a second dimension of encoded data may be generated by encoding data in two dimensions of the source data array, and so on, until each bit of encoded information in an Nth-dimensional data may be generated by encoding data in (N) dimensions of the source data array. In other embodiments, the dimension of the encoded data does not relate to the dimension of the source data encoded thereby, but is simply another encoding of the same or overlapping data. For example, one dimension of encoded data may be encoded by BCH component codes of t=2 over $GF(2^{\wedge}q_1)$, while another dimension of encoded data may be encoded a different type of component code, such as, BCH component codes of t=3 over $GF(2^{\wedge}q_2)$. Component codes may also be of different families e.g., Reed Solomon (RS) codes, Hamming codes, convolutional codes, etc. In yet other embodiments, each dimension may refer to a number of times code has been cycled through a decoder. For example, each sequential decoding dimension may re-cycle the output of a previous encoding dimension.

It may be appreciated that when used herein, "correcting" data or successfully decoding may refer to changing values of the data and not necessarily to generating the correct or accurate change. For example, a correction may be valid (a true correction) or invalid (a false correction).

Embodiments of the invention may be implemented in combination with or adapted from embodiments, for example, for generating and using multi-dimensional data, intersection decoding, soft and hard decoding, described in U.S. patent application Ser. No. 13/036,796 filed 28 Feb. 2011, U.S. patent application Ser. No. 13/036,622 filed 28 Feb. 2011, and U.S. patent application Ser. No. 12/651,489 filed 4 Jan. 2010, all of which are assigned to the common assignee of the present application and are incorporated herein by reference in their entirety.

Embodiments of the invention may be software-implemented using dedicated instruction(s) (e.g., stored in a memory 102, 118 of FIG. 1) or, alternatively, hardware-implemented using a designated encoders (e.g., encoder 100-116 of FIG. 1), decoders (e.g., one or more decoder 130-136 of FIG. 1) and/or logic arrays.

Embodiments of the invention may include an article such as a computer or processor readable non-transitory storage medium, or a computer or processor storage medium, such as for example a memory, a disk drive, or a USB flash memory, for encoding, including or storing instructions which when executed by a processor or controller (for example, processor 104 of FIG. 1), carry out methods disclosed herein.

Different embodiments are disclosed herein. Features of certain embodiments may be combined with features of other embodiments; thus certain embodiments may be combinations of features of multiple embodiments.

Although the particular embodiments shown and described above will prove to be useful for the many distribution systems to which the present invention pertains, further modifications of the present invention will occur to persons skilled in the art. All such modifications are deemed to be within the scope and spirit of the present invention as defined by the appended claims.

What is claimed is:

1. A method for decoding comprising: receiving data encoded by a component codeword configured to correct up to a maximum number of errors (q) in the data; generating an error locator polynomial (ELP) of a predetermined order (r) defining the locations in the component codeword of up to (r) errors, wherein: if the maximum number of errors (q) that the component codeword is configured to correct is equal to the predetermined order (r), the ELP includes (r) roots corresponding to up to (r) errors to be corrected by the component codeword and if the maximum number of errors (q) that the component codeword is configured to correct is less than the predetermined order (r), the ELP includes (q) roots corresponding to up to (q) errors to be corrected by the component codeword and (r-q) virtual roots added to generate the ELP of the predetermined order (r); and correcting up to (q) errors at locations in the component code defined by the (q) roots of the ELP.

2. The method of claim 1, wherein the (r-q) virtual roots define known locations in the component codeword, which are not corrected.

3. The method of claim 1 comprising extending the component codeword, wherein the (r-q) virtual roots define locations in the extended portion of the component codeword.

4. The method of claim 1, wherein the same decoder unit is used to solve component codes configured to correct up to different maximum numbers of errors (q).

5. The method of claim 1 comprising using the decoder unit to correct a component code predetermined to correct up to two errors (q=2) and three errors (q=3).

6. The method of claim 1 comprising using a separate decoder unit to correct a component code predetermined to correct up to a single error (q=1).

7. The method of claim 1, wherein the ELP is a cubic polynomial with a predetermined order of three (r=3).

8. The method of claim 7, wherein if the component codeword is predetermined to correct up to two errors (q=2), the ELP includes two roots corresponding to potential errors and one virtual root corresponding to no errors.

9. The method of claim 1, wherein the ELP is generated by using syndrome values of the component codeword to compute the coefficients of the ELP.

10. The method of claim 1, wherein the component codewords are BCH codes.

11. A system for decoding comprising: a memory to store data encoded by a component codeword configured to correct up to a maximum number of errors (q) in the data; and a decoder configured to correct up to a maximum number of errors (r) in the data, the decoder to generate an error locator polynomial (ELP) of a predetermined order (r) defining the locations in the component codeword of up to (r) errors, wherein if the maximum number of errors (q) that the component codeword is configured to correct is equal to the predetermined order (r), the ELP includes (r) roots corresponding to up to (r) errors to be corrected by the component codeword and if the maximum number of errors (q) that the component codeword is configured to correct is less than the predetermined order (r), the ELP includes (q) roots corresponding to up to (q) errors to be corrected by the component codeword and (r-q) virtual roots added to generate the ELP of the predetermined order (r), and the decoder to correct up to (q) errors at locations in the component code defined by the (q) roots of the ELP.

12. The system of claim 11, wherein the (r-q) virtual roots define known locations in the component codeword, which are not corrected.

13. The system of claim 11, wherein the decoder extends the component codeword, wherein the (r-q) virtual roots define locations in the extended portion of the component codeword.

14. The system of claim 11, wherein the decoder solves component codes configured to correct up to different maximum numbers of errors (r) and (q).

15. The system of claim 11, wherein the decoder solves a component code predetermined to correct up to two errors (q=2) and three errors (q=3).

16. The system of claim 11 comprising a separate decoder unit to correct a component code predetermined to correct up to a single error (q=1).

17. The system of claim 11, wherein the ELP is a cubic polynomial with a predetermined order of three (r=3).

18. The system of claim 17, wherein if the component codeword is predetermined to correct up to two errors (q=2), the ELP includes two roots corresponding to potential errors and one virtual root corresponding to no errors.

19. The system of claim 11, wherein the decoder generates the ELP by using syndrome values of the component codeword to compute the coefficients of the ELP.

20. The system of claim 11, wherein the component codewords are BCH codes.

* * * * *